(12) United States Patent
Matsuda et al.

(10) Patent No.: US 7,190,342 B2
(45) Date of Patent: Mar. 13, 2007

(54) SHIFT REGISTER AND DISPLAY APPARATUS USING SAME

(75) Inventors: Eiji Matsuda, Tenri (JP); Seijirou Gyouten, Tenri (JP); Hajime Washio, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 473 days.

(21) Appl. No.: 10/376,320

(22) Filed: Mar. 3, 2003

(65) Prior Publication Data

US 2003/0179174 A1     Sep. 25, 2003

(30) Foreign Application Priority Data

Mar. 25, 2002  (JP) ............... 2002-084302
Jan. 9, 2003    (JP) ............... 2003-003284

(51) Int. Cl.
*G11C 19/28* (2006.01)

(52) U.S. Cl. .......... 345/100; 345/95; 345/204; 345/214; 377/64; 377/70; 377/107

(58) Field of Classification Search .......... 345/82, 345/87, 90, 89, 95, 100, 204, 214; 377/56, 377/64, 73, 75, 115, 116, 70, 107
See application file for complete search history.

(56) References Cited

U.S. PATENT DOCUMENTS 4,560,982 A * 12/1985 Sonehara et al. ............ 345/89
4,746,915 A *  5/1988 Sekiya ...................... 345/205
4,785,297 A * 11/1988 Sekiya ...................... 327/202
6,664,943 B1  12/2003 Nakajima et al.
6,724,363 B1   4/2004 Satoh et al.

(Continued)

FOREIGN PATENT DOCUMENTS

JP   2000-322020 A   11/2000
TW       461180      10/2001

OTHER PUBLICATIONS

U.S. Appl. No. 09/568,889, filed May 11, 2000, entitled "Two-Way Shift Register and Image Display Device Using the Same".

(Continued)

*Primary Examiner*—Bipin Shalwala
*Assistant Examiner*—Vincent E. Kovalick
(74) *Attorney, Agent, or Firm*—Nixon & Vanderhye, PC

(57) ABSTRACT

In a shift register, which is for use in an image display apparatus of the TFT active matrix type in which a driver circuit is integrally provided on a display panel, and which is so arranged as to boost a start pulse SP to a start pulse SPO by using a level shifter, and to supply the start pulse SPO to a flip-flop F1 of a shift register section, the start pulse SP having an amplitude lower than a driving voltage and being supplied thereto, the shift register is provided with an operation control circuit for inactivating the level shifter when the first stage flip-flop F1 outputs an output signal S1 and activates the level shifter when a last stage flip-flop Fn outputs an output signal Sn. Therefore, it is possible to reduce power consumption of the level shifter during a period in which the start pulse SPO is transmitted from a flip-flop F2 to a flip-flop Fn−1.

29 Claims, 23 Drawing Sheets

U.S. PATENT DOCUMENTS 6,897,839 B2 * 5/2005 Noguchi et al. .............. 345/82
2001/0005196 A1 * 6/2001 Ishii ........................... 345/100

OTHER PUBLICATIONS

U.S. Appl. No. 09/578,440, filed May 25, 2000, entitled "Shift Register and Image Display Apparatus Using the Same".

U.S. Appl. No. 09/703,918, filed Nov. 1, 2000, entitled "Shift Register and Image Display Device".

Korean Office Action and English translation thereof mailed Mar. 29, 2005 in corresponding Korean application No. 10-2003-18417.

TW Office Action mailed Apr. 21, 2004 in corresponding TW application No. 092105893 and English translation thereof.

* cited by examiner

SHIFT REGISTER AND DISPLAY APPARATUS USING SAME

FIELD OF THE INVENTION

The present invention relates to a shift register, which is suitable for use in a driving circuit of a liquid crystal display apparatus, and which operates in response to an input signal of a relative low voltage, and a display apparatus, such as the liquid crystal display apparatus, using the same.

BACKGROUND OF THE INVENTION

Shift registers are widely used in a scanning signal line driving circuit and a data signal line driving circuit of a liquid crystal display apparatus, for example, in order to generate a scanning signal to be supplied to each scanning signal line, or in order to take timing for sampling each data signal from a video signal. Such scanning signal line driving circuits and data signal line driving circuits using shift registers are disclosed, for example, in Japanese Publication of Unexamined Patent Application, Tokukai, No. 2000-322020 (published on Nov. 24, 2000; corresponding to counterpart U.S. patent application Ser. No. 09/568,889), Japanese Publication of Unexamined Patent Application, Tokukai, No. 2000-339984 (published on Dec. 8, 2000; corresponding to counterpart U.S. patent application Ser. No. 09/578,440), and Japanese Publication of Unexamined Patent Application, Tokukai, No. 2001-307495 (published on Nov. 2, 2001; corresponding to counterpart U.S. patent application Ser. No. 09/703,918).

Meanwhile, power consumption of an electronic circuit is increased in proportion to a frequency, a load capacitance, and square of a voltage. Thus, for attaining lower power consumption, there is a trend to set a driving voltage lower and lower in the liquid crystal display apparatus itself and in a circuit to be connected to the liquid crystal display apparatus, such as a circuit for generating the video signal that is to be supplied to the liquid crystal display apparatus.

However, for example in pixel circuits, a scanning signal line driving circuit, and a data signal line driving circuit, and the like circuit, which are composed of polycrystal silicon thin file transistor so that a wide display area can be attained, difference between threshold voltages may become as high as several volts ([V]) between substrates or even within a substrate. Therefore, the driving voltage includes such a margin as to absorb effect of the difference between the threshold voltages. Thus, the driving voltage has not been lowered enough. On the other hand, the driving voltage is set, for example, at 5[V], 3.3[V] or even lower values in a circuit using a single crystal silicon transistor, such as the generating circuit for the video signal.

Therefore, a display panel receives, from an external circuit such as the generating circuit for the video signal, a start pulse lower than that of the driving voltage of a shift register. In this case, the shift register is provided with a level shifter for boosting the start pulse. Specifically, for example as demonstrated by a shift register 1 shown in FIG. 12, a level shifter 3 is provided in an input side of a shift register section 2. With this arrangement, a start pulse SP, which is supplied from the generating circuit for the video signal, and which has an amplitude as low as 5[V] as described above, is boosted to be a start pulse SPO (which is a driving voltage of the shift register section 2) having an amplitude as high as 15[V], so that the start pulse SPO is supplied to a first-stage flip-flop f1 of the shift register section 2.

The first-stage flip-flop f1 transmits the thus boosted start pulse SPO to a flip-flop f2, which is a next stage to the flip-flop f1, in synchronism with a clock signal CK supplied from the generating circuit for the video signal. Similar operations are sequentially performed through flip-flops f1, f2, . . . fn-1, and fn, which are connected each other in series. The flip-flops f1, f2, . . . fn-1, and fn sequentially output a selection pulse as output signals s1, s2, . . . , sn-1, and sn.

FIG. 13 is a block diagram showing an example of an arrangement of the level shifter 3. The level shifter 3 is provided with a pair of NMOS transistors n1 and n2, a pair of PMOS transistors p1 and p2, and two stages of invertors inv1 and inv2. The NMOS transistors n1 and n2 have gates, which are connected with each other, and drains, which are respectively connected with drains of the PMOS transistors p1 and p2. A source of the NMOS transistor n1 is grounded. Meanwhile, the gate and drain of the NMOS transistor n1 are connected with each other. A source of the NMOS transistor n2 receives the start pulse SP. Sources of the PMOS transistors p1 and p2 are commonly supplied with a high level driving voltage Vcc as high as 15[V], while gates thereof are commonly grounded.

Therefore, an output terminal that is a node between the drain of the PMOS transistor p2 and that of the NMOS transistor n2 outputs the start pulse SP, which has been inputted to the source of the NMOS transistor n2 and boosted to the driving voltage Vcc. The output is amplified by the two stages of the inverter inv1 and inv2, and then outputted as the start pulse SPO, which is thus boosted and is not inverted.

In the level shifter 3 arranged as above, the NMOS transistors n1 and n2, and the PMOS transistors p1 and p2 constitute a level shifter section of a current driving type. Thus, whether or not the start pulse SP is inputted, the PMOS transistors p1 and p2 are ON always, whereby the gates of the NMOS transistors n1 and n2 become high level so that the NMOS transistors n1 and n2 are ON always and let a current flow through themselves. Therefore, it is possible to boost the start pulse SP without any problem even if the start pulse SP has an amplitude lower than a threshold voltage of the NMOS transistor n2.

On the other hand, in a level shifter of a voltage driving type, in which an input switching element is switched (turned) ON and OFF in accordance with a level of an input signal, it is impossible to carry out such boosting when the start pulse SP has an amplitude lower than a threshold voltage of input switching element. However, the level shifter of the current driving type disadvantageously has high power consumption because the current is flowing through the level shifter of this type always.

SUMMARY OF THE INVENTION

The present invention has an object to provide shift register capable of operating normally by using a level shifter even if it is so arranged that an input signal has a small amplitude for lower power consumption, and reducing power consumption at the level shifter, and a display apparatus using the same.

A shift register of the present invention including plural stages of flip-flops for sequentially transmitting therethrough an input signal supplied thereto, is provided with a level shifter for boosting the input signal, which has an amplitude lower than that of a driving voltage of the flip-flops, and supplying the thus boosted input signal to the first stage flip-flop; and an operation control circuit for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where x and y are arbitrary integers and x<y.

In this arrangement, in the shift register including the plural stages of flip-flops through which the input signal such as a start pulse is sequentially transmitted in synchronism with a clock signal, in inputting the input signal having an amplitude lower than that of a driving voltage of the flip-flops, the operation control circuit turns OFF (inactivates) the level shifter when the input signal is transmitted by the x-th stage flip-flop, and turns ON (activates) the level shifter when the input signal is transmitted by the y-th stage flip-flop. In other words, the level shifter is inactivated during a period in which the input signal is transmitted from the x-th stage to the y-th stage flip-flops, and is activated only during a period having possibility that the input signal is inputted to the level shifter, that is, a period between a time at which the input signal is transmitted from the y-th stage flip-flop to a time at which an input signal of the next cycle reaches the x-th stage.

Therefore, it is possible to realize normal operation even if an input signal having a low amplitude for lower power consumption, and cut the power consumption of the level shifter during the period in which the input signal is transmitted from the x-th stage to the y-th stage flip-flops.

Moreover, the shift register of the present invention is preferably so arranged that the x-th stage flip-flop is the first stage flip-flop, and the y-th stage flip-flop is the last stage flip-flop.

With this arrangement, it is possible to attain greatest reduction in the power consumption because y-x, that is, the period during which the shifter register is inactivated, is the longest.

Furthermore, a shift register of the present invention including plural stages of flip-flops for sequentially transmitting therethrough an input signal supplied thereto and being switchable in shift directions, is provided with a level shifter for boosting the input signal, which has an amplitude lower than that of a driving voltage of the flip-flops, and supplying the thus boosted input signal to the s-th stage flip-flop; and an operation control circuit for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where s, x and y are arbitrary integers and $s \leq x < y$.

In this arrangement, in the shift register including the plural stages of flip-flops through which the input signal such as a start pulse is sequentially transmitted in synchronism with a clock signal, and being switchable in terms of its shift direction, that is, so-called two-way shift register, in inputting the input signal having an amplitude lower than a driving voltage of the flip-flops, the operation control circuit turns OFF (inactivate) the level shifter when the input signal is transmitted by the x-th stage flip-flop, and turns ON (activate) the level shifter when the input signal is transmitted by the y-th stage flip-flop. In other words, the level shifter is inactivated during a period in which the input signal is transmitted from the x-th stage to the y-th stage flip-flops, and is activated only during a period having possibility that the input signal is inputted to the level shifter, that is, a period between a time at which the input signal is transmitted from the y-th stage flip-flop to a time at which an input signal of the next cycle reaches the x-th stage.

Here, the input signal is supplied to the arbitrary s-th stage ($s \leq x$) flip-flop. Thus, outputs from the s-th stage and following flip-flops are effective. In other words, for example, when the outputs from those flip-flops are used for image display, the s-th stage and following are effective display area. When the shift direction is switched over to the other, the flips-flops which are the first to s-1 th stages before the switching-over become the last to last-(s-2)th stages after the switching-over. Shift operation is carried out as described above.

Therefore, it is possible to realize normal operation even if an input signal having a low amplitude for lower power consumption, and cut the power consumption of the level shifter during the period in which the input signal is transmitted from the x-th stage to the y-th stage flip-flops.

Moreover, the shift register of the present invention is preferably arranged such that the x-th stage flip-flop is the s-th stage flip-flop, and the y-th stage flip-flop is the last stage flip-flip.

With this arrangement, it is possible to attain greatest reduction in the power consumption because y-x, that is, the period during which the shifter register is inactivated, is the largest (longest). Furthermore, for example, in case the shift register is used for image display, the last stage to the last-(s-2) stage flip-flops are out of the effective display area, but those flip-flops functions as dummies, thereby attaining the arrangement that the level shifter is activated in an arbitrary timing, after selecting the effective display area.

Furthermore, the shift register of the present invention is preferably arranged such that the level shifter includes a level shifter section of a current driving type having an input switching element for receiving the input signal and being closed always throughout operation of the level shifter.

Differently from a level shifter of a voltage driving type, in which an input switching element is switched ON and OFF (closed and opened) in accordance with a level of an input signal, the level shifter of the current driving type is so arranged that the input switching element is turned ON throughout operation of the level shifter. Therefore, even if the input signal has an amplitude lower than a threshold voltage of the input switching element, it is possible to boost the input signal without problem.

On the other hand, as described above, the level shifter of the current driving type has a larger power consumption than the level shifter of the voltage driving type, because the input switching element is closed throughout the operation of the level shifter in the level shifter of the current driving type. However, the use of the operation control circuit, which stops the operation of the level shifter when the input signal is not inputted, reduces the power consumption of the level shifter of the current driving type. This attains especially suitable application of the present invention.

Moreover, a shift register of the present invention preferably further includes an input control circuit for supplying, when the operation control circuit turns OFF the level shifter, a signal to an input terminal of the input switching element of the level shift section, the signal having such a level as to open the input switching element.

The above arrangement is explained below, discussing, as an example, a case where the input switching element is an MOS transistor. With respect to the level shifter of the current driving type in which, as described above, the input switching element is closed throughout the operation of the level shifter, if it is so arranged that the input signal is supplied to a gate, the input control circuit opens the input switching element when a signal having such a level as to block between a drain and a source. Moreover, if it is so arranged that the input signal is applied to the source, the input control circuit opens the input switching element, for example, by applying to the source a signal having a potential substantially equivalent to the drain.

In this way, it is possible to realize inactivation of the level shifter of the current driving type. Further, it is possible to realize a shift register of lower power consumption, in which a feedthrough current passing the input switching element during a period in which the level shifter is inactivated.

Furthermore, the shift register of the present invention is preferably so arranged that the level shifter includes an output stabilizing circuit for maintaining an output voltage to a predetermined value when the level shifter is turned OFF.

There is a risk that the operation of the flip-flops connected to the level shifter may become unstable when the output voltage of the level shifter become unstable during the period in which the level shifter is inactivated. With this arrangement, in which the output stabilizing circuit holds the output voltage of the level shifter to the predetermined value, it is possible to prevent erroneous operation of the flip-flop due to the unstable output voltage, thereby realizing a more stable shift register.

Moreover, a display apparatus of the present invention is provided with scanning signal lines and data signal lines crossing each other; and a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines, wherein at least one of the scanning signal line driving circuit and the data signal line driving circuit is integrally provided on a display panel, and includes the above-mentioned shift register.

In this arrangement, in a matrix display apparatus of a so-called driver monolithic type, in which the pixel areas are formed by being sectored by the scanning signal lines and the data signal lines crossing each other, and the driving circuit for sequentially selecting the scanning signal lines and the data signal lines is integrally formed on the display panel, at least that one of the scanning signal line driving circuit and the data signal line driving circuit that is integrally formed includes any one of the shift registers described above.

The driving circuit, which is thus integrally formed and is made of polycrystal silicon, has lower mobility than an external circuit made of single crystal silicon. Thus, the driving circuit has a high operation voltage, while the external circuit has a lower driving voltage. Thus, it is necessary to provide a level shifter to the driving circuit to which a signal from the external circuit is inputted. Thus, the shift register of the present invention may be applied in this case.

In this way, it is possible to realize a display panel of the driver monolithic type having a lower power consumption.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 to 7, an embodiment of the present invention will be described below.

Figure 1:
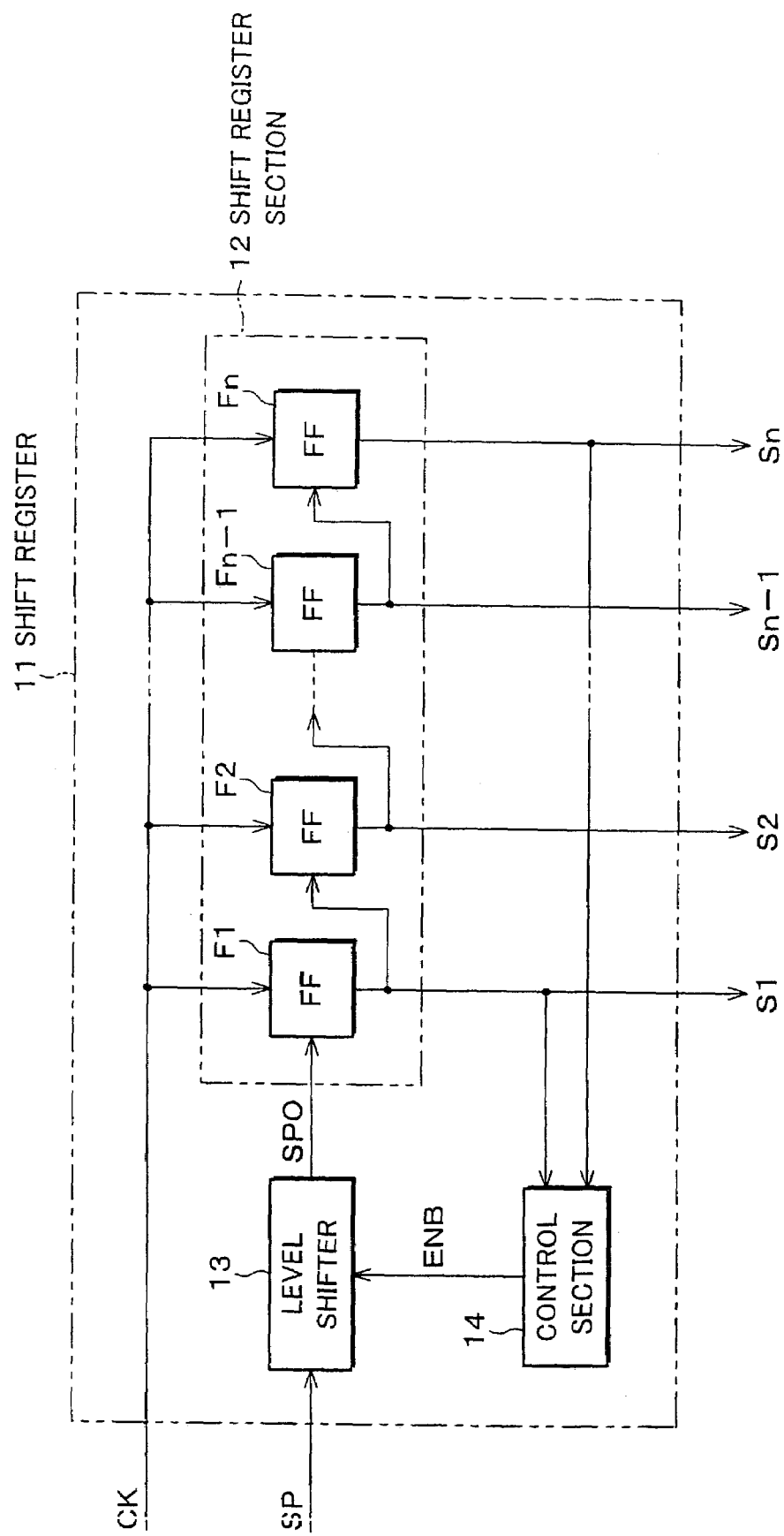
FIG. 1 is a block diagram illustrating an electric configuration of a shift register of an embodiment of the present invention.

FIG. 1 is a block diagram illustrating an electric configuration of a shift register 11 of the embodiment of the present invention. The shift register 11, which is provided with a level shifter 13 on an input side of the shift register section 12, is so arranged that a start pulse SP, which is supplied from a generating circuit that generates a video signal (generating circuit for the video signal), and which has an amplitude as low as 5[V] is boosted to a start pulse SPO (which is a driving voltage Vcc of the shift register section 12) as high as 15[V], for example, and supplies the start pulse SPO to a first-stage flip-flop F1 in the shift register section 12.

The shift register section 12 is composed of n number of stages of flip-flops F1, F2, . . . , Fn-1, and Fn, which are operated by the driving voltage Vcc in synchronism with a clock signal CK that is supplied from the generating circuit for video signal and is boosted, for example, as described in Japanese Publication of Unexamined Patent Application, Tokukai, No. 2000-339984 (published on Dec. 8, 2000), by the level shifter (even though it is not illustrated). The first-stage flip-flop F1, in synchronism with the clock signal CK, transmits the boosted start pulse SPO to the flip-flop F2, which is the next stage thereto. Likewise, similar operation is sequentially carried out through the flip-flops F2, F3, . . . , Fn-1, and Fn, which are connected with each other in series after the flip-flop F1. In this way, a selection pulse is consequently outputted as output signals S1, S2, . . . , Sn-1, and Sn, respectively from the F1, F2, . . . , Fn-1, and Fn.

It should be noted that the shift register 11 is provided with an operation control circuit 14 for outputting an enable signal ENB, which inactivates the level shifter 13 in response to transmission output of the start pulse SPO from the first-stage flip-flop F1, and activates the level shifter 13 in response to transmission output of the start pulse SPO from the last-stage flip-flop Fn.

Figure 2:
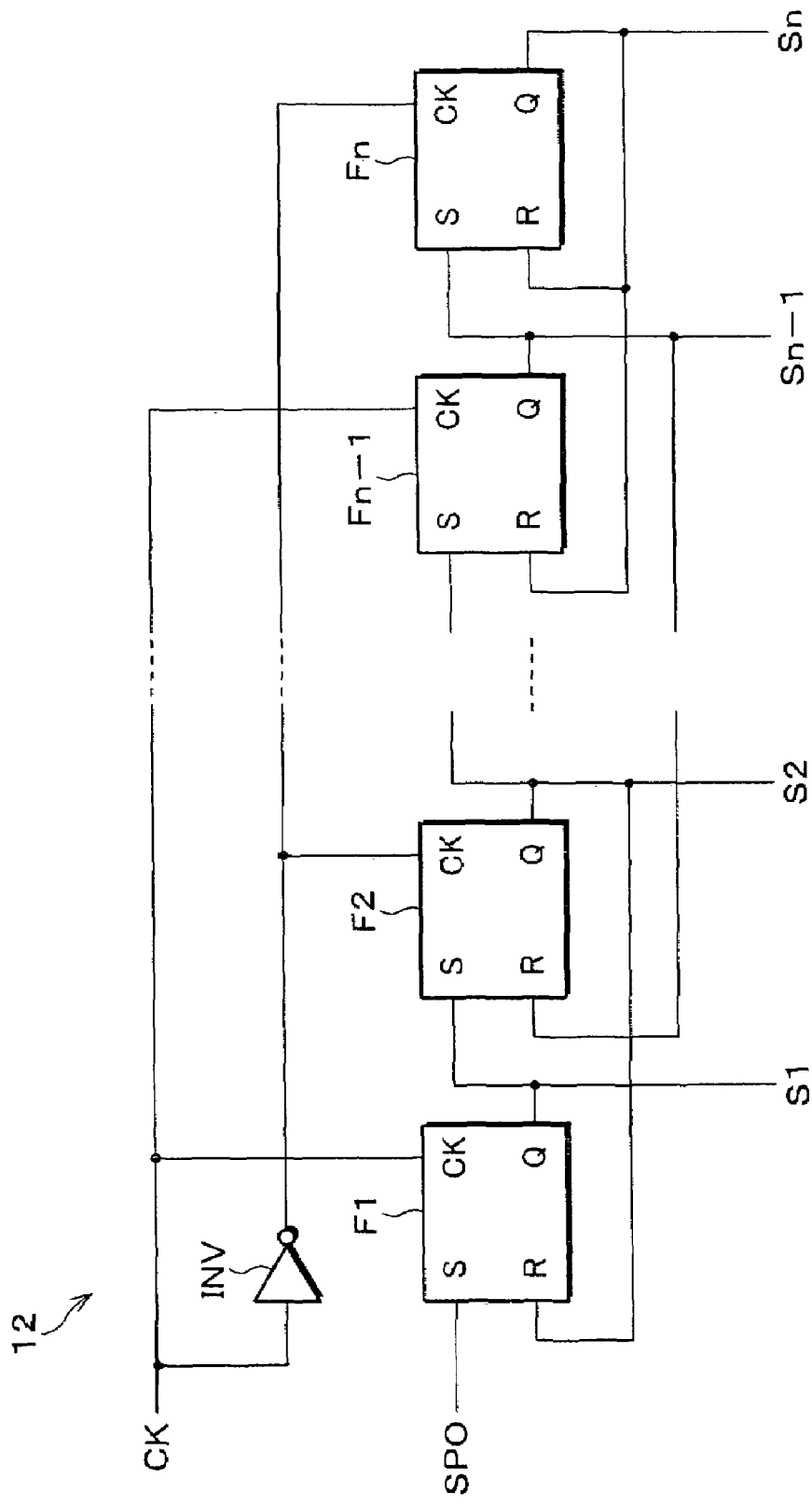
FIG. 2 is a block diagram showing an example arrangement of a shift register section of the shift register shown in FIG. 1.

FIG. 2 is a block diagram illustrating in detail an example arrangement of the shift register section 12. In this example, each flip-flops F1 to Fn is composed of a set/reset flip-flop (SR flip-flop). The clock signal CK, which is externally supplied, is directly supplied to clock input terminals CK of odd-numbered stages of the flip-flops, namely, the flip-flops F1, F3, . . . , and Fn-1. Meanwhile, after inverted by an inverter INV, the clock signal CK is supplied to clock input signal terminals CK of even-numbered stages of the flip-flops, namely, F2, F4, . . . , and Fn.

The boosted start pulse SPO is supplied to a set terminal S of the first-stage flip-flop F1, and the output signal S1 is outputted from an output terminal Q of the flip-flop F1, and supplied to a set terminal S of the next flip-flop F2. From an output terminal Q of the flip-flop F2, an output signal S2 is outputted and supplied to a set terminal S of the flip-flop F3 (not shown), while also supplied to a reset terminal R of the preceding flip-flop F1. Likewise, output signals S3 to Sn-1 are respectively outputted from output terminals Q of the flip-flops F3 to Fn-1, and then respectively supplied to respective set terminals S of the next flip-flops thereof, that is, the flip-flops F4 to Fn, respectively, while supplied to respective reset terminals R of the preceding flip-flops thereof, that is, the flip-flops F2 to Fn-2. From an output terminal Q of the flip-flop Fn, the output signal Sn is outputted and supplied to a reset terminal R of the preceding flip-flop Fn-1 and a reset terminal R of its own.

Figure 3:
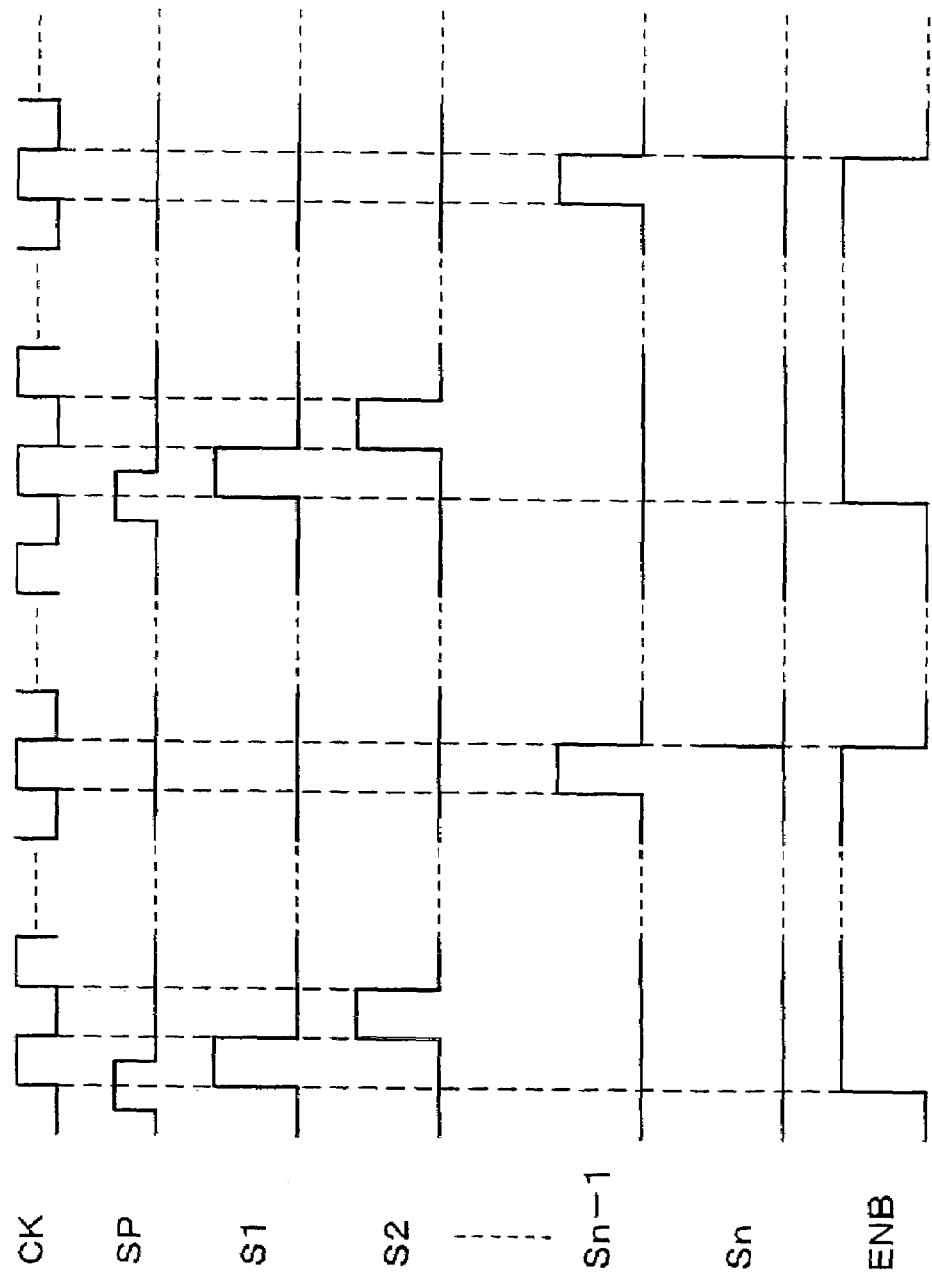
FIG. 3 is a waveform chart, which explains how the shift register operates.

Therefore, as shown in FIG. 3, the flip-flop F1 is set in rise timing of clock signal CK (timing in which the clock signal CK) when the start pulse SP becomes high level and active. The following stage flip-flips F2 to Fn are set each half period of the clock signal CK, and sequentially transmit the start pulse SP though themselves. Moreover, the flip-flop F1 to Fn-1 are respectively reset in accordance with output of the following flip-flops F2 to Fn, when the following flip-flop F2 to Fn are set. The last-stage flip-flop Fn is reset in accordance with set output of its own right after the flip-flop Fn itself outputs the set output.

The output signals S1 to Sn-1 may be used as the output of the shift register 11 having such arrangement. However, the output signal Sn outputted from the last stage is used for operation control of a level-shifter 13 performed by a later-described operation control circuit 14. In this case, as shown in FIG. 3, the enable signal ENB becomes high level and inactive when the output signal S1 from the first stage is outputted, and becomes low level and active when the output signal Sn from the last stage is outputted.

Figure 4:
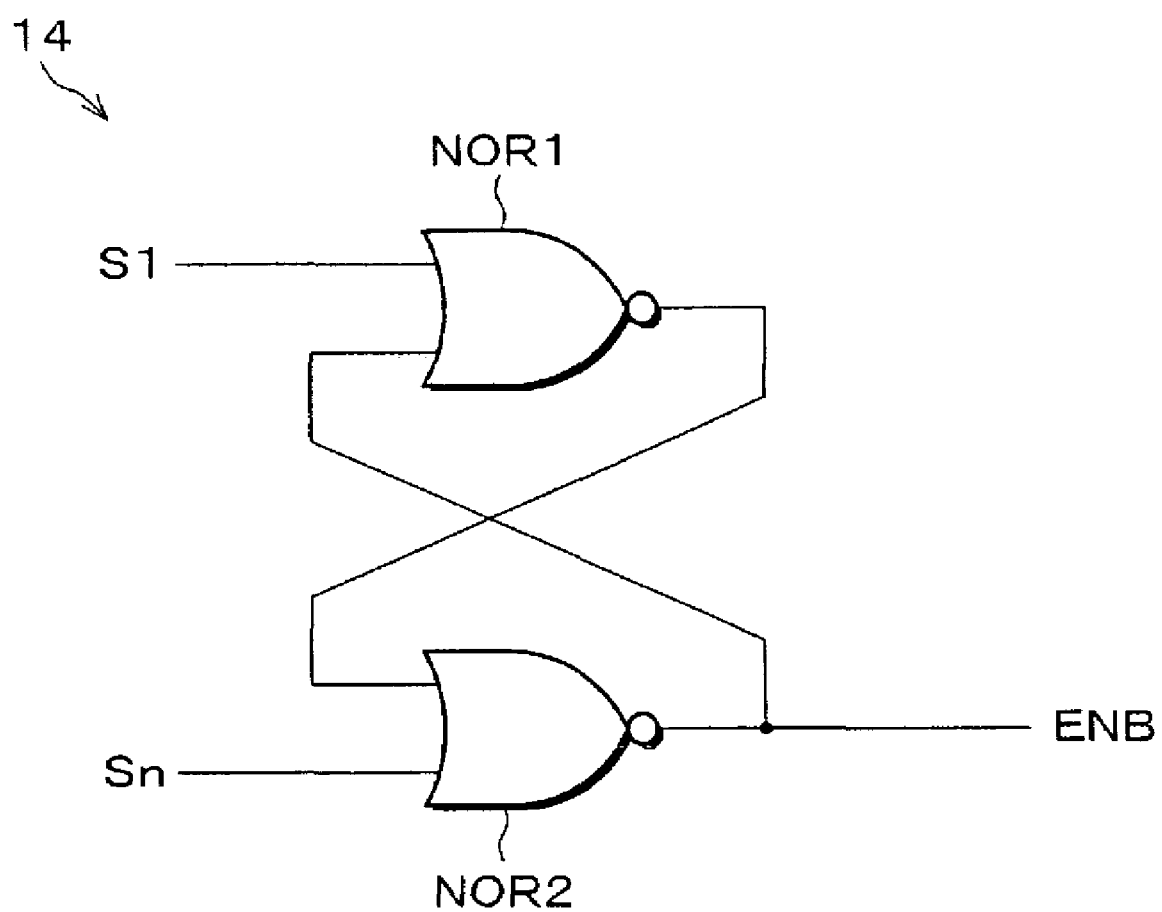
FIG. 4 is a block diagram illustrating an example arrangement of an operation control circuit of the shift register shown in FIG. 1.

FIG. 4 is a block diagram illustrating an example arrangement of the operation control circuit 14. The operation control circuit 14 is composed of set/reset flip-flops (SR flip-flops) constituted of two inverting OR circuits NOR1 and NOR2 having a CMOS structure. The output signal S1 from the first-stage flip-flop F1 is supplied to one of input terminals of the inverting OR circuit NOR1, which is one of the pair of inverting OR circuits, while the output signal Sn from the last-stage flip-flop Fn is supplied to one of input terminals of the inverting OR circuit NOR2, which is the other of the pair. The other input terminals of the inverting OR circuits NOR1 and NOR2 respectively receive output from the output from their counterparts, that is, the other input terminal of the inverting OR circuits NOR1 receives the output from the inverting OR circuit NOR2, and vice versa.

Thus, the enable signal ENB, which is the output of the inverting OR circuit NOR2, is set to be high level and inactive, when the output signal S1 is outputted, because as described above, the output of the inverting OR circuit NOR 1, that is, the other input of the inverting OR circuit NOR2, becomes low level and the output signal Sn is low level. Thereafter, even if the output signal S1 becomes low level, in accordance with the high level output of the inverting OR circuit NOR2, the output of the inverting OR circuit NOR1 is self-held to the low level and that of the inverting OR circuit NOR2 is self-held to the high level, while the enable signal ENB is kept high level.

On the contrary, when the output signal Sn is outputted, the enable signal ENB, which is the output of the inverting OR circuit NOR 2, is reset to be active and low level, whereby both of the two inputs for the inverting OR circuit NOR 1 become low level. This causes the output of the inverting OR circuit NOR1 to be high level. Thereafter, even if the output signal Sn becomes low level, in accordance with the high level output of the inverting OR circuit NOR1, the output of the inverting OR circuit NOR2 is self-held to low level, while the enable signal ENB is kept low level, as it is reset, until the output signal S1 is outputted again.

Figure 5:
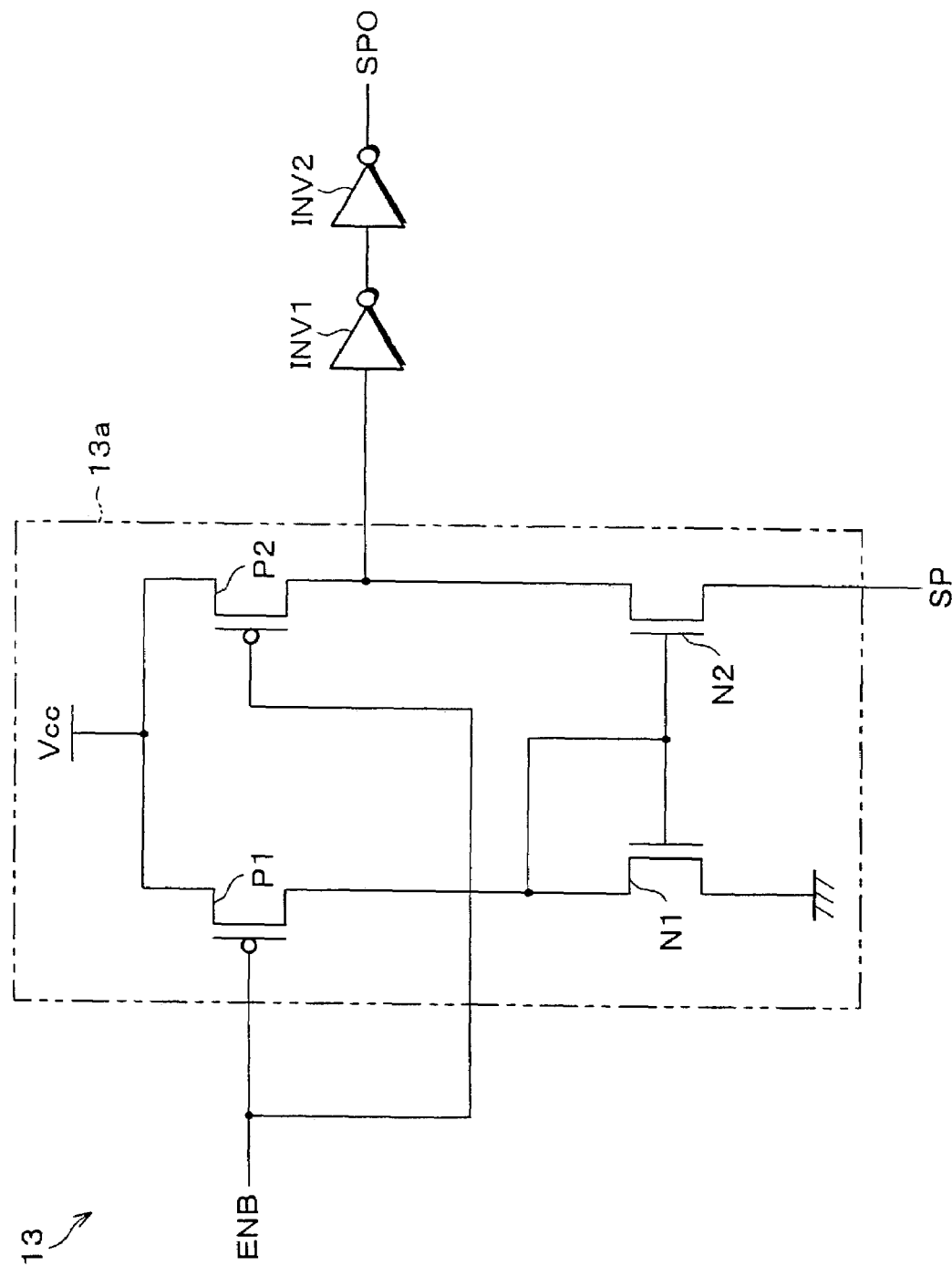
FIG. 5 is a block diagram illustrating an example arrangement of a level shifter of a current driving type of the present invention.

The level shifter 13 is composed of a level shifter of the current driving type shown in FIG. 5, so that the level shifter 13 can boost the start pulse SP without problem even if the start pulse SP has a low amplitude. FIG. 5 is a block diagram showing an example arrangement of the level shifter 13. The level shifter 13 has a similar arrangement as the level shifter 3 shown in FIG. 13. Namely, the level shifter 13 is provided with a pair of NMOS transistor N1 and N2, a pair of PMOS transistors P1 and P2, and two stages of invertors INV1 and INV2. Gates of the NMOS transistors N1 and N2 are connected with each other. Drains thereof are respectively connected with those of the PMOS transistors P1 and P2. A source of the NMOS transistor N1 is grounded. A gate and drain of the NMOS transistor N1 are connected with each other. A source of the NMOS transistor N2 receives the start pulse SP. Further, Sources of the PMOS transistors P1 and P2 commonly receive a high-level driving voltage Vcc as high as 15[V] as described above.

From an output terminal, which is a node between the drain of the PMOS transistor P2 and the drain of the NMOS transistor N2, a start pulse SP that has been inputted into the source of the NMOS transistor N2 is boosted to the driving voltage Vcc, and then outputted. The output is amplified at the two stages of the inverters INV1 and INV2, and outputted as a start pulse SPO, which is boosted and not inverted.

Therefore, on the contrary to the level shifter of a voltage driving type, in which the input switching element opens and closes in accordance with a level of the input signal and which is inactivated when the amplitude of the start pulse SP becomes less than a threshold voltage of an input switching element, it is so arranged as to form the level shifter of the current driving type in which the input switching element (NMOS transistor N2) to which the input signal is always supplied throughout operation of the level shifter is closed always. With this arrangement, it is possible to boost the start pulse SP without any problem, and to apply this arrangement to a case in which transistor property is low or a high driving is required.

Figure 13:
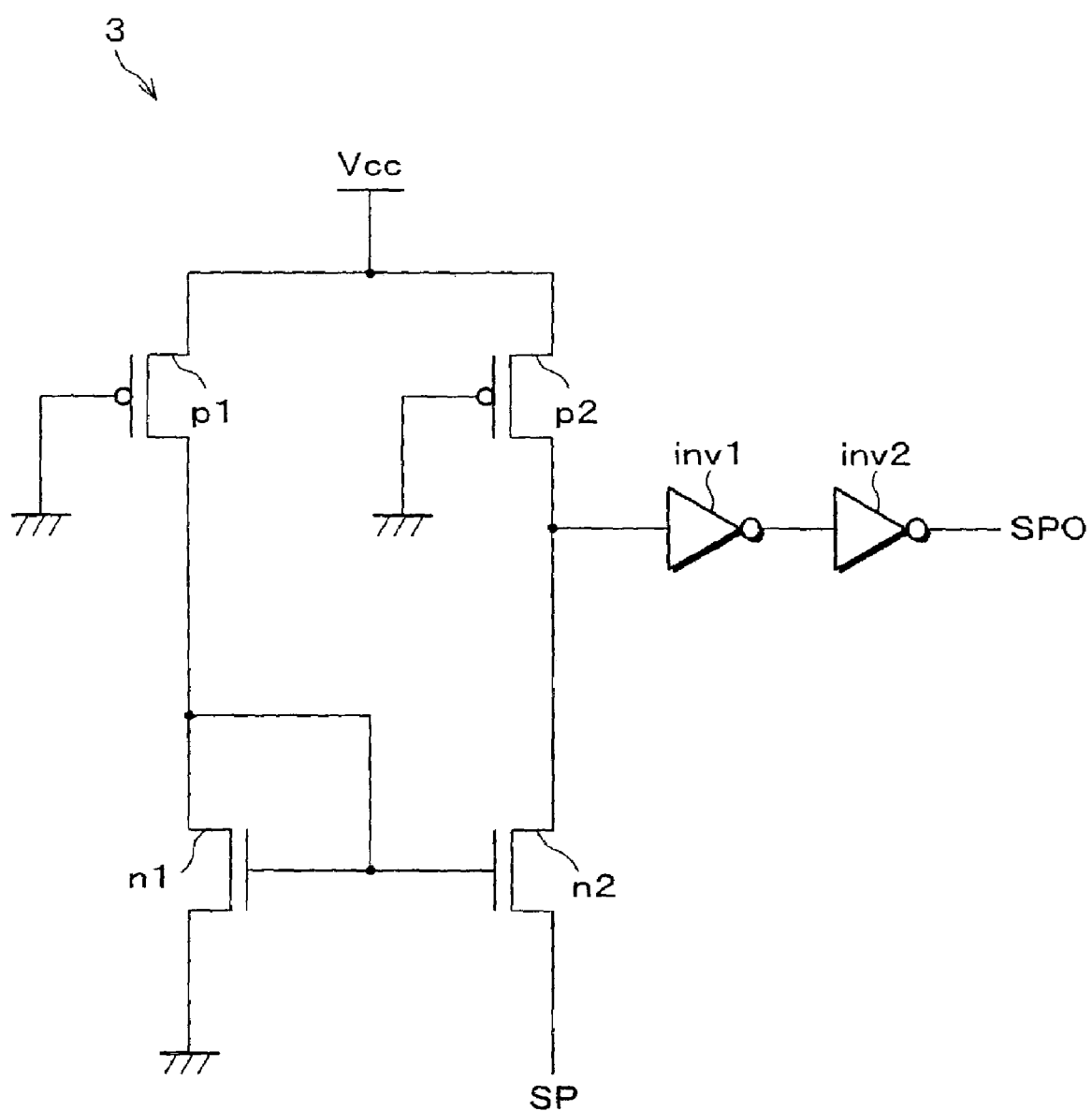
FIG. 13 is a block diagram illustrating an example arrangement of a level shifter of the shift register shown in FIG. 12.

However, different from the level shifter 3 shown in FIG. 13, the gates of the PMOS transistors P1 and P2 commonly receive the enable signal ENB in the level shifter 13. Therefore, in the level shifter section 13a of the current driving type, which is composed of the NMOS transistors N1 and N2, and the PMOS transistors P1 and P2, the PMOS transistors P1 and P2 are turned ON only during a time in which the enable signal ENB is active and low level, whereby the gates of the NMOS transistors N1 and N2 become high level. This turns ON the NMOS transistors N1 and N2, so as to allow a current to flow. In this way, it is possible to reduce power consumption of the level shifter 13 of the current driving type, which has a high power consumption.

In the above explanation, the operation control circuit 14 inactivates the level shifter 13 in response to an output signal S1 from a first-stage flip-flop F1, and activates the level shifter 13 in response to an output signal Sn from a last-stage flip-flop Fn. However, it may be so arranged as to inactivate the level shifter 13 in response to an output signal Sx from a flip-flop Fx of an arbitrary x-th stage, and as to activate the level shifter 13 in response to an output signal Sy from a flip-flop Fy of a y-th stage (where x<y). However, it is possible to attain a longest period in which the level shifter 13 is inactivated, by arrange such that the x-th stage is the first stage and the y-th stage is the last stage as above, thereby reducing the power consumption as much as possible.

Figure 6:
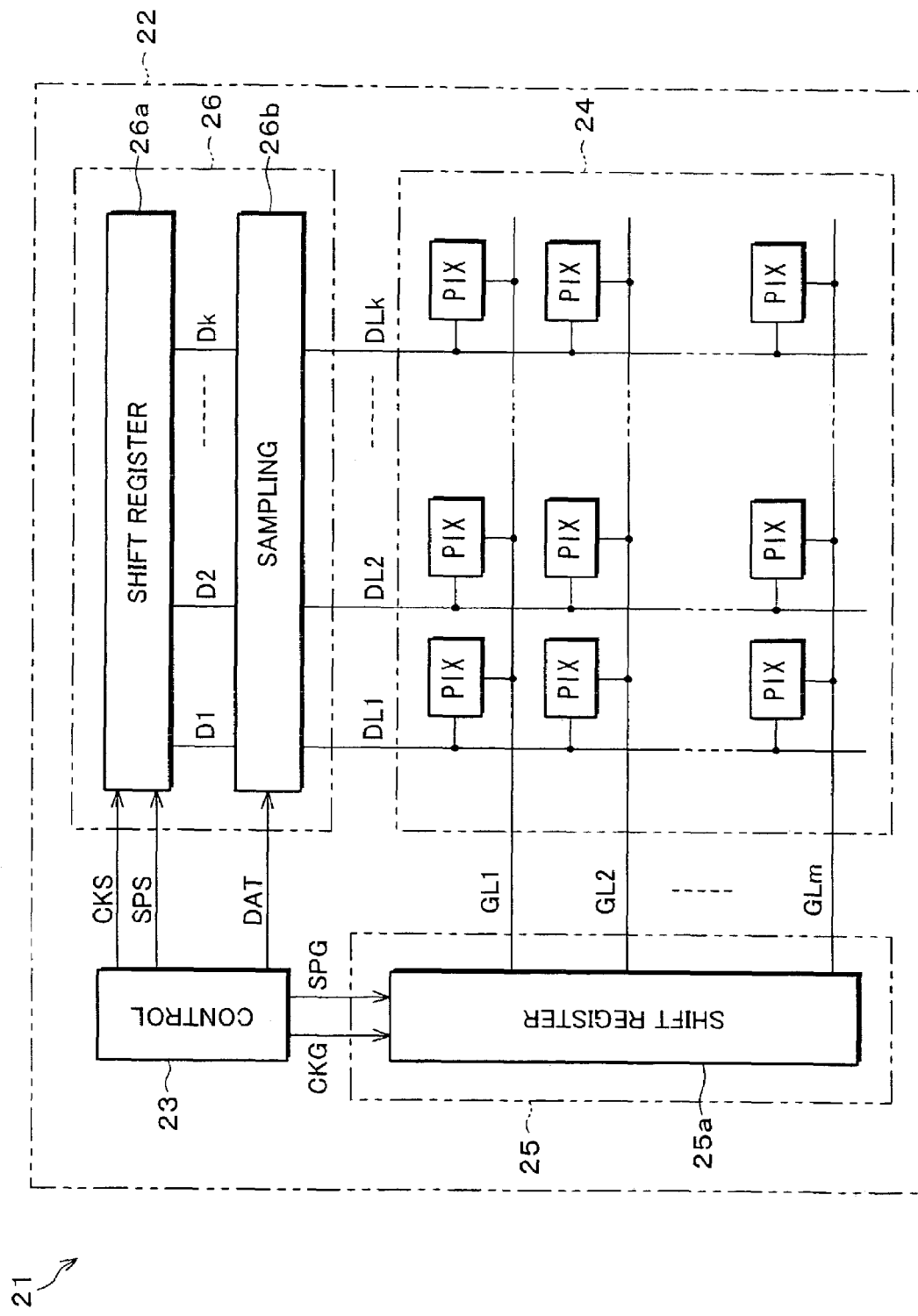
FIG. 6 is a block diagram of an example of image display apparatuses in which a shift register of the present invention is applied.

The shift register 11 having the above arrangement is widely applicable as a shift register for dealing with an input signal having an amplitude lower than a driving voltage. As an example of preferable usage, a case where the shift register 11 is applied in an image display apparatus will be explained below. FIG. 6 is a block diagram of such an image display apparatus 21 in which the shift register 11 is used. The image display apparatus 21 is schematically constituted by mounting, on a display panel 22, a control circuit 23 for generating a video signal DAT. The display panel 22 is provided with a display section 24 in which pixels PIX are aligned in matrix, and a scanning signal line driving circuit 25, a data signal line driving circuit 26, which drive each pixel PIX. The scanning signal line driving circuit 25 is composed of a shift register 25a and a data signal line driving circuit 26 is composed of a shift register 26a and a sampling circuit 26b. The shift register 11 is used as at least one of the shift registers 25a and 26a.

The display section 24 and both the driving circuits 25 and 26 are monolithically formed on a substrate for the purpose of reducing labor in manufacturing and line capacitance. For more integration of the pixels PIX and larger display area, the display section 24 and the driving circuits 25 and 26 are composed of polycrystal silicon thin film transistor formed on a substrate, and the like. Further, even if a usual glass substrate having a distortion point of 600° C. or less, the polycrystal silicon thin film transistor is manufactured under a process temperature of 600° C. or less, in order to avoid warping and bending due to a process that is carried out at a temperature higher than the distortion point of the usual glass substrate.

Figure 7:
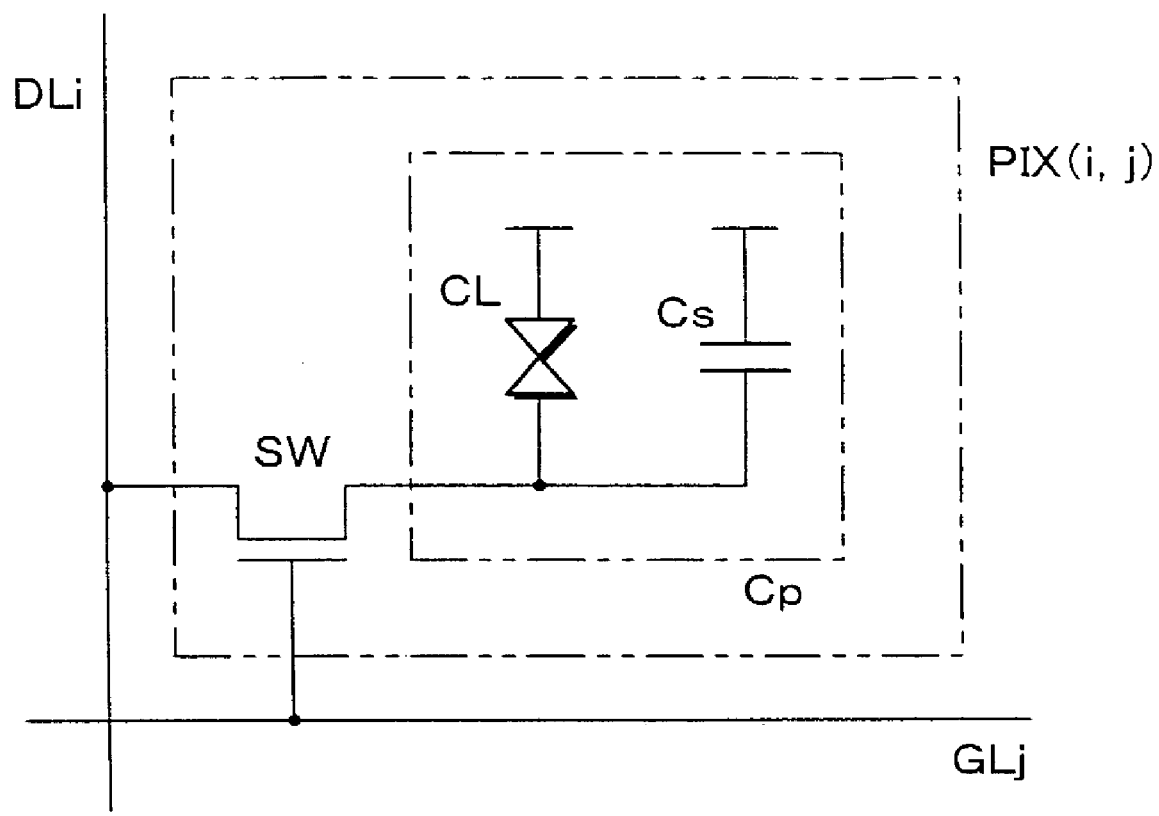
FIG. 7 is an equivalent circuit diagram of a pixel in the image display apparatus shown in FIG. 6.

The display section 24 performs image display by using the scanning signal line driving circuit 25 and the data signal line driving circuit 26 so as to write the video signal DAT in each of areas of the pixels PIX via an m number of scanning signal lines GL1 to GLm and a k number of data signal lines DL1 to DLk, which cross each other so as to form the areas of the pixels PIX. The video signal DAT is supplied from the control circuit 23. Each pixel PIX is arranged, for example, as shown in FIG. 7. In FIG. 7, the pixel PIX is labeled with an arbitrary integers i and j where i≦k and j≦m, as well as the scanning signal line GL and the data signal line DL.

Each pixel PIX is provided with (i) a field-effect transistor (switching element) SW whose gate is connected to the scanning line signal GL and source is connected to the data signal line DL, and (ii) a pixel capacitor Cp connected to a drain of the field-effect transistor SW. Another electrode of the pixel capacitor Cp is connected to a common electrode line, which is shared by all the pixel PIX. The pixel capacitor Cp is composed of a liquid crystal capacitor CL and a supplemental capacitor Cs, which is added if necessary.

Therefore, when the scanning signal line GL is selected, the field-effect transistor SW becomes conducting and a voltage applied to the data signal line DL is applied to the pixel capacitor Cp. On the other hand, during a selection period of the scanning signal line GL during which the scanning signal line GL is selected ends, and field-effect transistor SW is opened, the pixel capacitor Cp holds a voltage that is supplied thereto. Here, a transmitivity and a reflectance of a liquid crystal change in accordance with the voltage applied onto the liquid crystal capacitor CL. Thus, it is possible to change display condition of the pixels PIX in accordance with the video signal DAT by selecting the scanning signal lines GL and applying, to the data signal line DL, a voltage that is in accordance with the video signal DAT.

Here, the video signal DAT to each pixel PIX is transmitted in a time-sharing manner from the control circuit 23 to the data signal line driving circuit 26. Thus, in a timing based on the clock signal CKS having a predetermined period as a timing signal, and the start pulse SPS, the data signal line driving circuit 26 extracts, out of the video signal DAT, video data to be supplied to each pixel PIX. Specifically, the shift register 26a sequentially shifts the start pulse SPS in synchronism with the clock signal CKS from the control circuit 23, thereby generating output signals D1 to Dk having different timings that are shifted by a predetermined interval. The sampling circuit 26b carries out sampling of the video signal DAT in a timing indicated by the data signals D1 to Dk, and outputs the video signal DAT to the respective data signal lines DL1 to DLk.

Likewise, in the scanning signal line driving circuit 25, the shift register 25a sequentially shifts the start pulse SPG in synchronism with the clock signal CKG from the control circuit 23, thereby outputting, to the respective scanning signal lines GL1 to GLm, scanning signals having different timings that are shifted by predetermined intervals.

In the image display apparatus 21 having the above arrangement, the display section 24, and the driving circuits 25 and 26, which are formed on the display panel 22, are composed of a polycrystal silicon thin film transistor or the like as described above. The driving voltage Vcc is set to a voltage as high as 15[V] for example. Meanwhile, the control circuit 23, formed on another integrated circuit chip, is composed of single crystal silicon transistor, and has a driving voltage that is set to a voltage as low as 5[V] or a voltage less than 5[V] and the driving voltage Vcc.

Even though the display section 24, the driving circuits 25 and 26, and the control circuit 23 are formed on respectively different substrates, signals to be transmitted between the driving circuits 25 and 26 are significantly less in number than signals transmitted between the display section 24 and the driving circuits 25 and 26, and are as many as the video signal DAT, the start pulses SPS and SPG, and the clocks CKS and CKG. Moreover, because the control circuit 23 is composed of a single crystal silicon transistor, it is easy to secure a sufficient driving capacity. Therefore, even if the display section 24, the driving circuits 25 and 26, and the control circuit 23 are formed on respectively different substrates, increases in the labor in manufacturing, line capacitance, and power consumption are so suppressed that the increases will not be large enough to be causative of a problem.

With this arrangement in which the driving circuits 25 and 26, which are monolithically formed on the display panel 22, are composed of polycrystal silicon or the like, and the level shifter 13, which is required for the driving voltage higher than that of the external circuit, is activated only during the period in which the start pulse SP is inputted, it is possible to realize a display panel having low power consumption.

Another embodiment of the present invention is described below, with reference to FIGS. 8 and 9.

Figure 8:
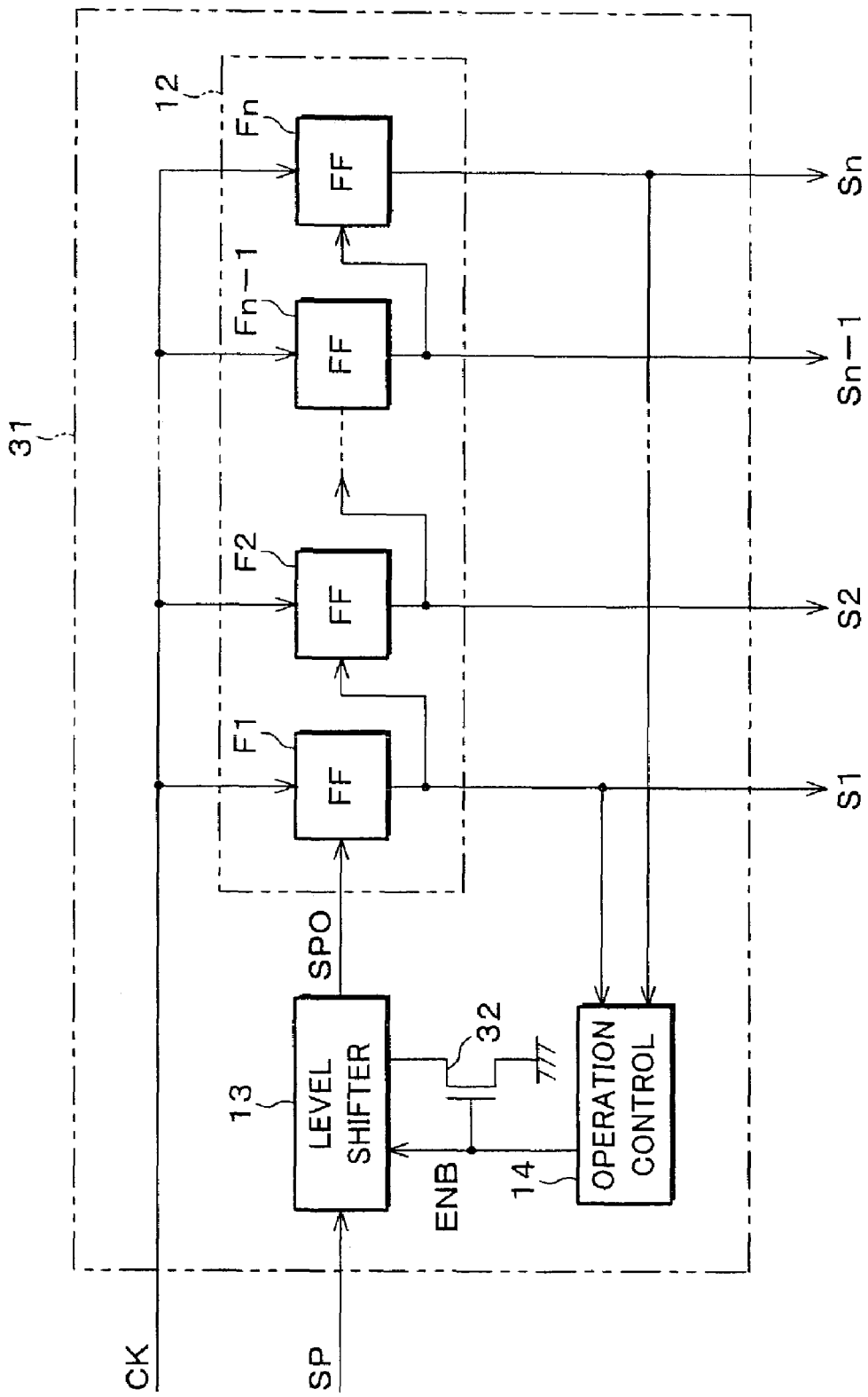
FIG. 8 is a block diagram illustrating an electric configuration of a shift register of another embodiment of the present invention.

FIG. 8 is a block diagram illustrating an electric configuration of a shift register 31 of the another embodiment of the present invention. As the shift register 31 is similar to the shift register 11, the shift register 31 is labeled in the same manner as those in the shift register 11 in terms of corresponding sections, and explanation thereof is omitted here. It should be noted here that the shift register 31 is provided with an input control circuit 32. The input control circuit 32, in response to an enable signal ENB, supplies, to an input terminal of a switching element of a level shifter section 13a, a signal that has such a level as to open the input switching element, when an operation control circuit 14 inactivates a level shifter 13.

Figure 9:
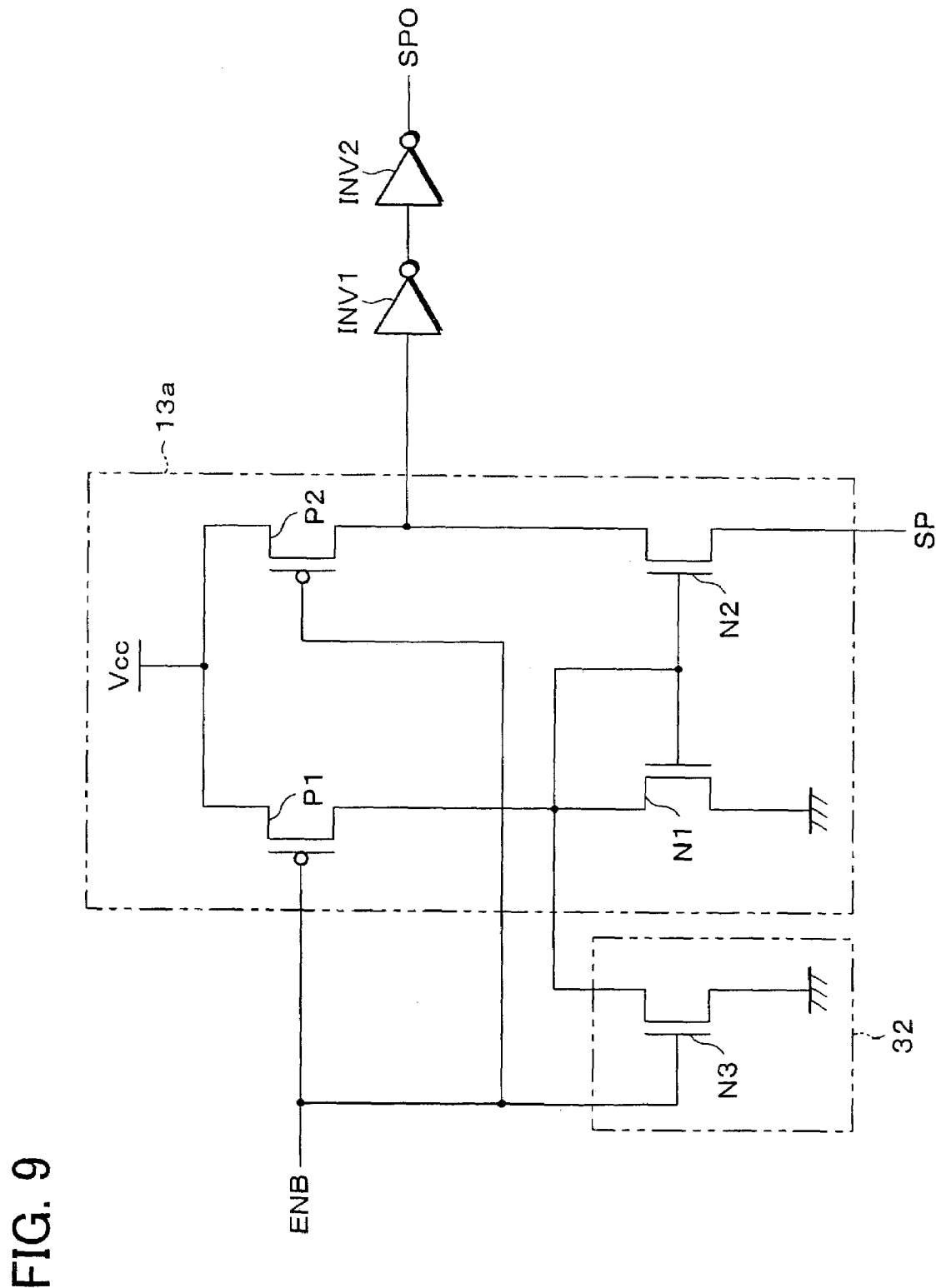
FIG. 9 is a block diagram showing an example arrangement of an input control circuit and a level shifter section in the shift register shown in FIG. 8.

FIG. 9 is a block diagram illustrating an example arrangement of the input control circuit 32 and the level shifter section 13a. The input control circuit 32 is composed of an NMOS transistor N3, which is provided between gates and sources of the NMOS transistors N1 and N2. The enable signal ENB is supplied to a gate of the NMOS transistor N3.

Therefore, when the enable signal ENB is active and low level, the NMOS transistor N3 is turned OFF, whereby the level shifter section 13a is operated. On the contrary, when the enable signal ENB becomes inactive and high level, the NMOS transistor N3 is turned ON, thereby supplying a ground level to the gates of the NMOS transistors N1 and N2 so as to turn OFF the NMOS transistors N1 and N2. In this way, it is possible to stop the operation of the level shifter section 13a.

Namely, in case where there is no NMOS transistor N3, even if the enable signal ENB becomes inactive and high level thereby turning OFF the PMOS transistors P1 and P2, drain potentials of the MOS transistors P1 and N1, and gate potentials of the NMOS transistors N1 and N2 are in unstable conditions. On the contrary, with the arrangement in which the NMOS transistor N3 is provided so that the drain potentials of the MOS transistors P1 and N1, and the gate potentials of the NMOS transistors N1 and N2 will be ground level, it is possible to surly turn OFF the NMOS transistors N1 and N2.

In addition, a voltage that is outputted by the input control circuit 32 when the level shifter 13 is not operated is only required to be out of an input dynamic range of the level shifter 13. However, in case the level shifter 13 is of the current driving type as described above, it is better to set the voltage to be such a voltage as to turn OFF the NMOS transistor N2, which is the input switching element, in other words, to be such a voltage as to cause no flow of a feedthrough current, because it is possible to eliminate power consumption due to the feedthrough current, and realize a shift register that has lower power consumption.

With this arrangement, it is possible to realize inactivation of the level shifter 13 of the current driving type, and reduce a current of the NMOS transistor N2, which is the input switching element when the level shifter 12 is not operated.

Described below is still another embodiment of the present invention, referring to FIGS. 10 and 11.

Figure 10:
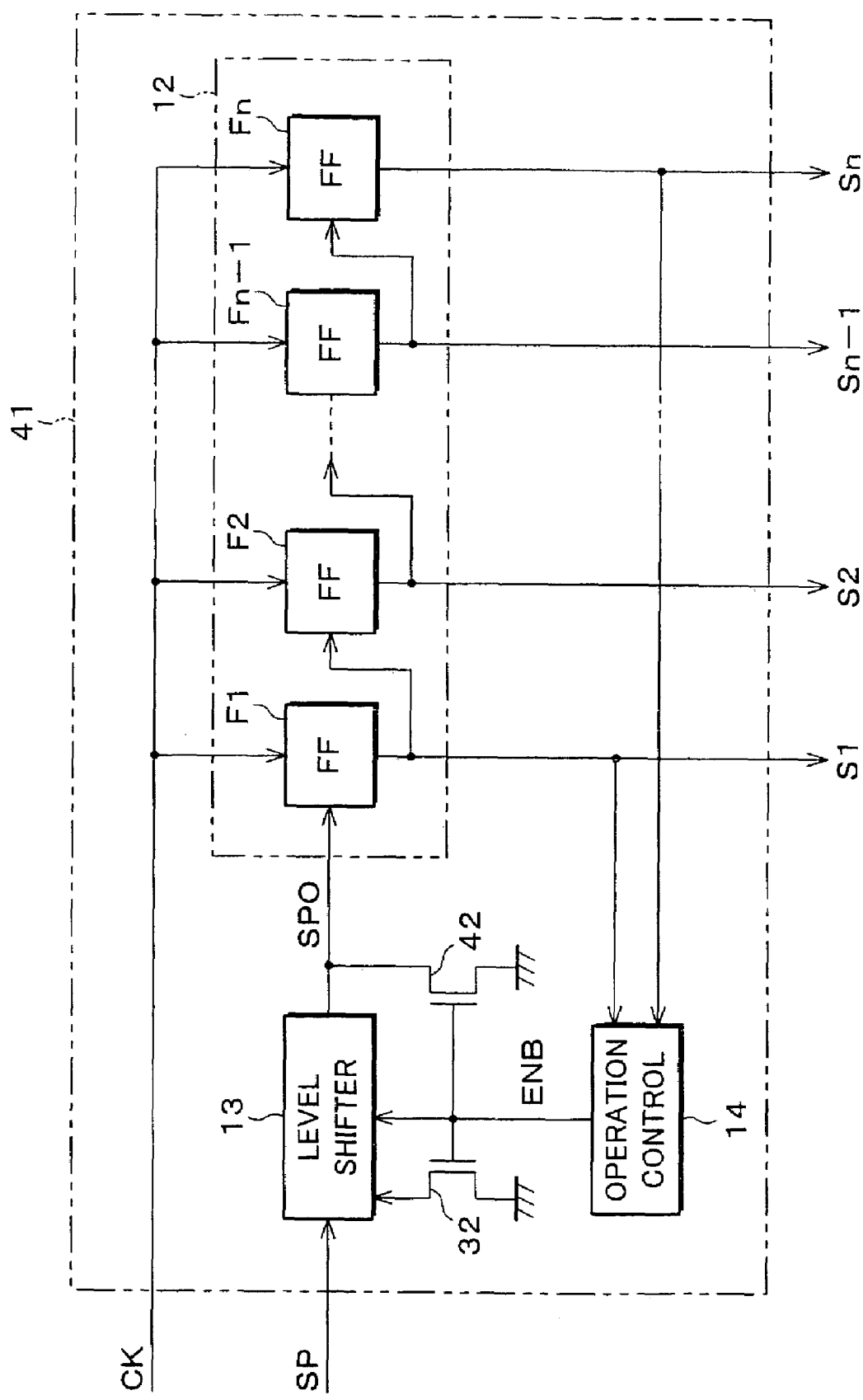
FIG. 10 is a block diagram illustrating an electric configuration of a shift register of still another embodiment of the present invention.

FIG. 10 is a block diagram of an electric configuration of a shift register 41 of the still another embodiment of the present invention. The shift register 41 is similar to the shift register 31, and corresponding sections thereof are labeled in the same manner as in the shift register 31, and their explanation is omitted here. What should be paid attention here is that the shift register 41 is provided with an output stabilizing circuit 42 for holding, to a predetermined value, an output voltage of a level shifter section 13a when an operation control circuit 14 inactivates a level shifter 13 in response to an enable signal ENB.

Figure 11:
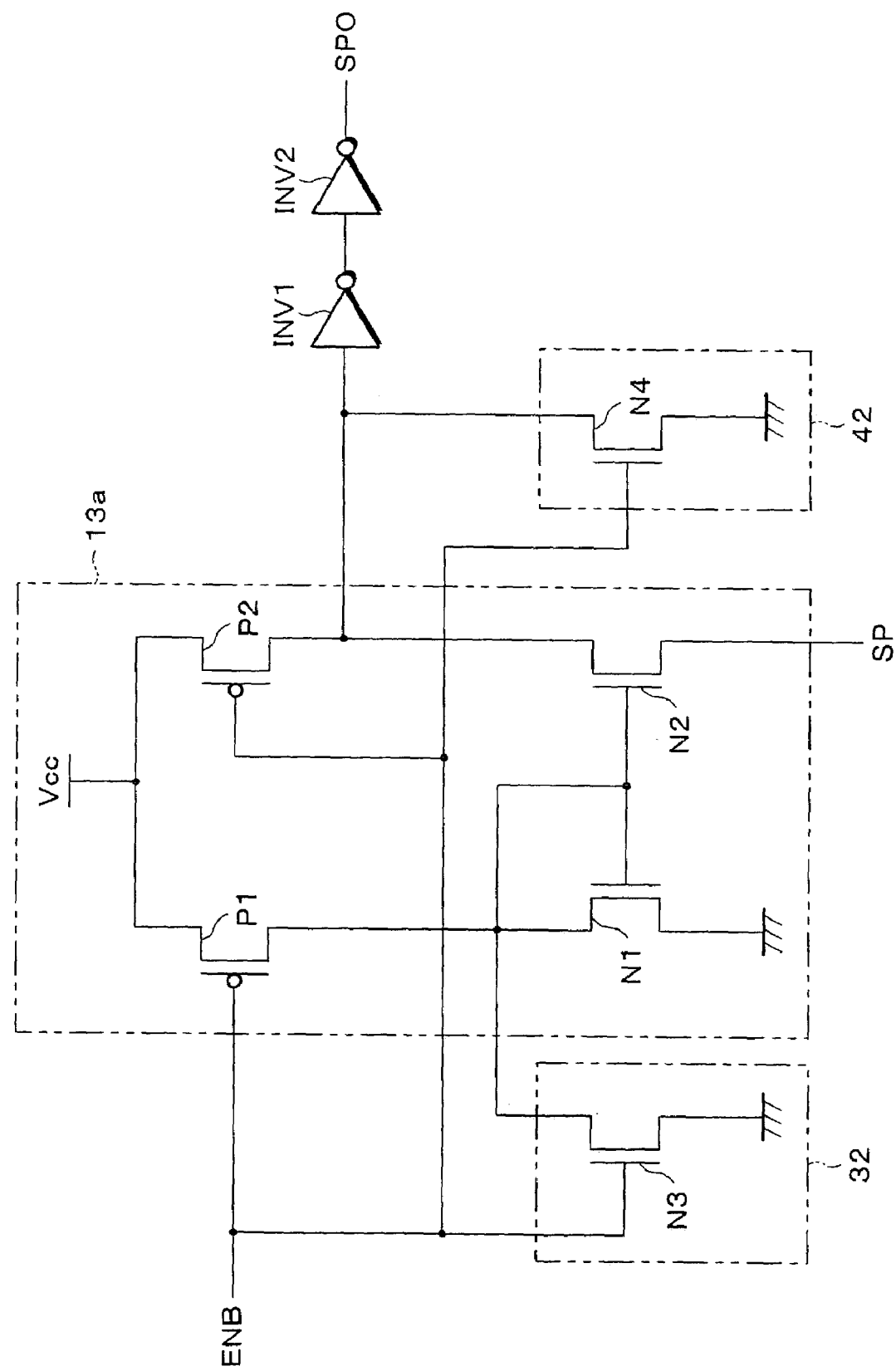
FIG. 11 is a block diagram showing an example embodiment of an output stabilizing circuit, an input control circuit and a level shifter section of the shift register shown in FIG. 10.
Figure 12:
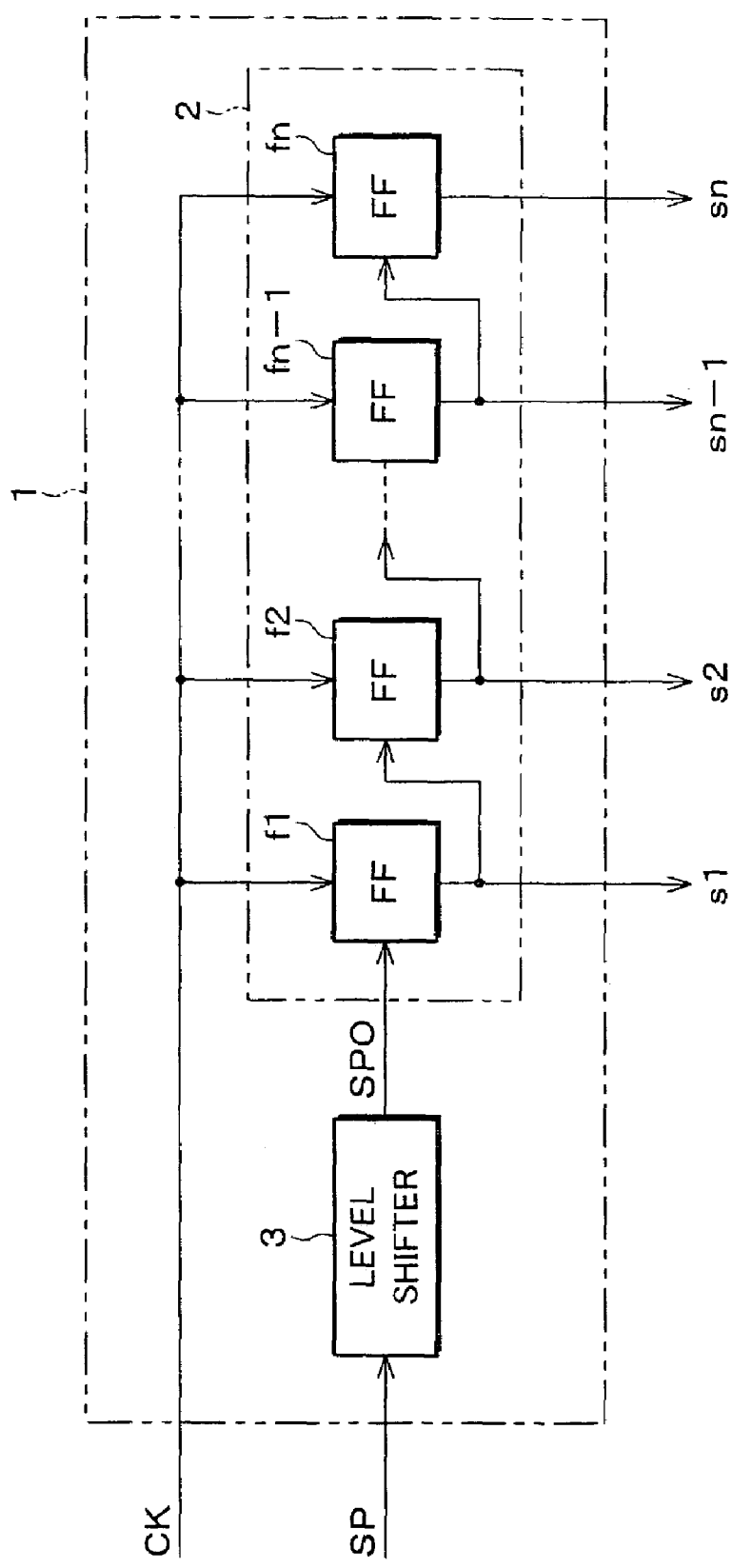
FIG. 12 is a block diagram of a shift register of a typical conventional shift register.

FIG. 11 is a block diagram illustrating an example arrangement of the output stabilizing circuit 42, an input control circuit 32, and the level shifter 13a. The output stabilizing circuit 42 is composed of an NMOS transistor N4. The enable signal ENB is supplied to a gate thereof. A source thereof is grounded, and a drain thereof is connected to an output terminal of the level shifter section 13a, that is, an input terminal of an inverter INV1.

Therefore, when the enable signal ENB becomes active and low level, the NMOS transistor N4 is turned OFF, and a start pulse SPO boosted by a level shifter 3 is outputted. On the contrary, when the enable signal ENB becomes inactive and high level, the NMOS transistor N4 is turned ON, and causes an input of the inverter INV1 to be a ground level. With this arrangement, it is possible to hold, to a predetermined value, the output voltage of the level shifter 13 while the level shifter 13 stop operating, so as to prevent erroneous operation of the flip-fop F1, thereby realizing a more stable shift register.

Described below is yet another embodiment of the present invention, with reference to FIGS. 14 to 18.

Figure 14:
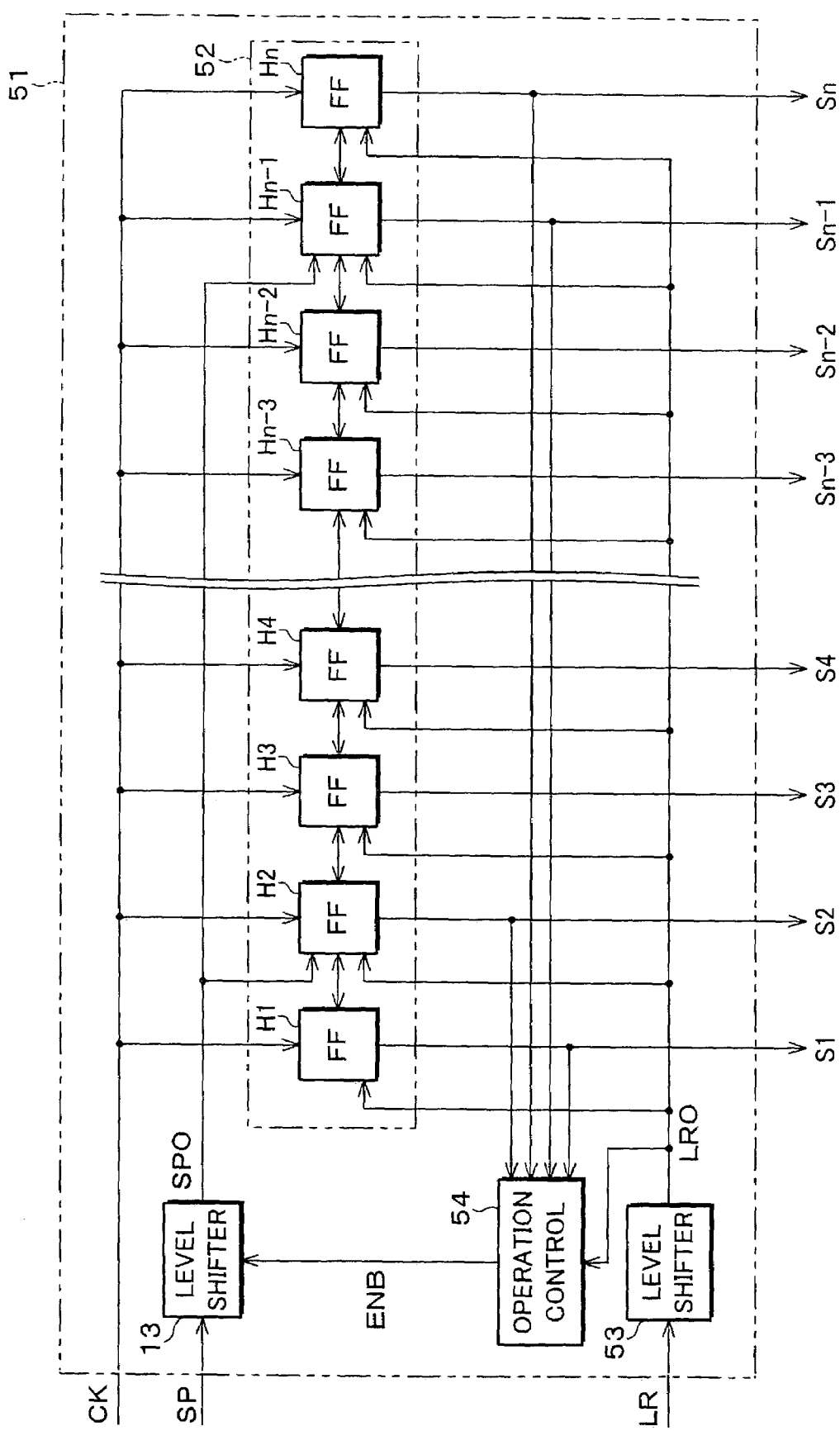
FIG. 14 is a block diagram showing an electric configuration of a shift register of yet another embodiment of the present invention.

FIG. 14 is a block diagram illustrating an electric configuration of a shift register 51 of the yet another embodiment of the present invention. Corresponding sections in the shift register 51 are labeled in the same fashion as in the shift register 11, and their explanation is omitted here. Attention should be drawn to that the shift register 51 is provided with a shift register section 52 composed of a bi-directional shift register. The shift register section 52 is composed of an n number of stages of flip-flop circuits, H1, H2, . . . , Hn-1, and Hn.

However, assuming a direction in which an output signal S2, . . . , Sn-1, and Sn are outputted in this order as selection pulses is a forward direction, in the shift register section 52, which is capable of switching its shifting direction in response to a switching signal LR, shifting operation in the forward direction is performed when the switching signal LR is of high level. On the contrary, when the switching signal LR is of low level, the selection pulses are outputted in a reverse direction, that is, the output signals Sn-1, Sn-2, S2, and S1 are outputted in this order. The switching signal LR is, similarly to the start pulse SP, a low amplitude signal having an amplitude as low as 5[V], and which is generated by a control circuit 23 of an image display apparatus 21, or the like. The switching signal LR is boosted to a switching signal LRO by a level shifter 53 having a similar configuration as the level shifter 13, the switching signal LRO having an amplitude as high as 15[V] as described above. Then, the switching signal LRO is supplied commonly to each of the flip-flop circuits H1 to Hn.

Here, in the shift register section 52, the first-stage flip-flop circuit H1 and the last-stage flip-flop Hn are dummies. Thus, in the image display apparatus 21 and the like, corresponding data signal lines DL1 and DLn are formed out of an effective display area, and thus make no contribution to displaying. However, the flip-flop circuits H1 and Hn, as later described, have a function to reset the preceding flip-flop in the two-way shifting operation. Specifically, when the switching signal LR is of high level, the shifting operation in the forward direction is performed. Thus, the flip-flop circuit Hn is the last stage for the shifting operation. In accordance with the output of the flip-flop circuit Hn, the preceding flip-flop Hn-1 is reset. On the other hand, when the switching signal LR is of low level, the shifting operation is performed in the reverse direction. Thus, the flip-flop circuit H1 is the last stage of the shifting operation. In accordance with the output of the flip-flop circuit H1, the preceding flip-flop H2 is reset. As described above, the flip-flop circuits H1 and Hn are dummies, and their outputs are not used in the effective display area of the image display apparatus 21 and the like, but can be used for activating the level shifter 13. Specifically, as later described, by using the flip-flop circuits H1 and Hn, it is possible to so arrange that the activation of the level shifter 13 is performed in a timing after selection of the effective display is ended. For this, in the shift register section 52 composed of the n number of stages of flip-flop circuits H1 to Hn, the flip-flop circuits, which are used as dummies, are set arbitrarily in accordance with the timing for activating the level shifter 13.

However, the same dummy is necessary in scanning in the reverse direction. Thus, where the flip-flop circuit receiving the start pulse SPO, excluding the dummy flip-flop circuit provided at the first-stage, is put as an s-th stage flip-flop circuit Hs (in the shift-register section 52, s=2), and a flip-flop circuit to inactivate the level shifter 13 is put as an x-th stage flip-flop circuit Hx (in the shift register section 52, x=2), it is necessary to satisfy that s≦x. Moreover, where a flip-flop circuit to activate the level shifter 13 is put as an y-th stage flip-flop circuit Hy (in the shift register section 52, y=n), it is necessary to satisfy that x<y. It is preferable that x=s and y=n as described above. When x=s and y=n, the s-th stage to the last n–th stage, in other words, a period during which the level shifter 13 are inactivated is maximum, thus reducing power consumption as much as possible.

Figure 15:
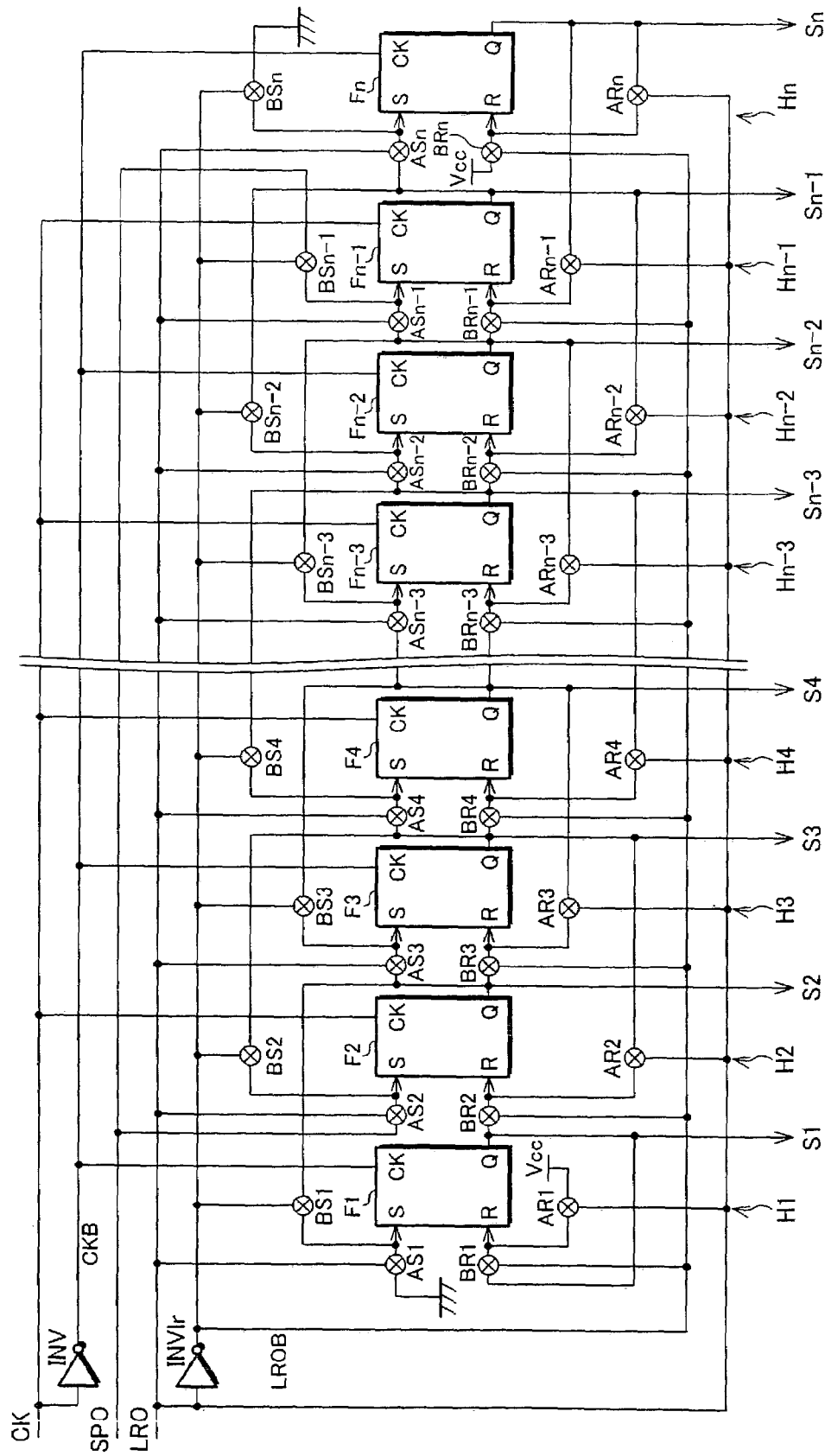
FIG. 15 is a block diagram illustrating, in detail, a shift register section of the shift register shown in FIG. 14.

FIG. 15 is a block diagram illustrating the shift register section 52 in detail. In order to realize the two-way shift operation, the flip-flop circuits H1 to Hn, whose basic structures are the previously mentioned flip-flops F1 to Fn, are respectively provided with a pair of analog switches, namely, analog switches AS1 to ASn, and BS1 to BSn (which are respectively referred by reference marks AS and BS when referred collectively), which are connected to set terminals S. Further, again in order to realize the two-way shift operation, the flip-flop circuits H1 to Hn are respectively provided with a pair of analog switches, namely, analog switches AR1 to ARn, and BR1 to BRn (which are respectively referred by reference marks AR and BR when referred collectively), which are connected to reset terminals R. Moreover, provided is an inverter INV1r for supplying, to the analog switches BS and BR, a switching signal LROB, which is inversion of the switching signal LRO.

As to the set terminal S of the flip-flop F1, the analog switch AS1 is closed when the switching signal LRO is of high level, so as to ground the set terminal S, and is opened when the switching signal LRO is of low level. Meanwhile, the analog switch BS1 is opened when the switching signal LRO is of high level, and is closed when the switching signal LRO is of low level, so as to connect the set terminal S to an output terminal Q of the next flip-flop F2.

Moreover, as to the reset terminal R of the flip-flop F1, the analog switch AR1 is closed when the switching signal LRO is of high level, so as to supply a high level driving voltage Vcc to the reset terminal R, and is opened when the switching signal LRO is of low level. Meanwhile, the analog switch BR1 is opened when the switching signal LRO is of high level, and is closed when the switching signal LRO is of low level, so as to supply an output of the flip-flop corresponding to itself and thus reset the reset terminal R.

As to the set terminal S of the next flip-flop F2, the analog switch AS2 is closed when the switching signal LRO is of high level, so as to supply the start pulse SPO, and is opened when the switching signal LRO is of low level. Meanwhile, the analog switch BS2 is opened when the switching signal LRO is of high level, and is closed when the switching signal LRO is of low level, so as to connect the set terminal S to an output terminal Q of the next flip-flop F3.

Moreover, as to the reset terminal R of the flip-flop F2, the analog switch AR2 is closed when the switching signal LRO is of high level, so as to supply, to the reset terminal R, an output from an output terminal Q of the next flip-flop F3, and is opened when the switching signal LRO is of low level. Meanwhile, the analog switch BR2 is opened when the switching signal LRO is of high level, and is closed when the switching signal LRO is of low level, so as to supply, to the reset terminal R, an output from the output terminal Q of the preceding flip-flop F1 and thus reset the flip-flop F2.

As to the set terminals S of the following stages of flip-flops F3 to Fn-2, the analog switch AS3 to ASn-2 are closed when the switching signal LRO is of high level, so as to supply, to the set terminals S, an output of their preceding stages, namely, the flip-flops F2 to Fn-3, and are opened when the switching signal LRO is of low level. Meanwhile, the analog switches BS3 to BSn-2 are opened when the switching signal LRO is of high level, and is closed when the switching signal LRO is of low level, so as to supply, to the set terminals S, an output of their next stages, namely, the flip-flops F4 to Fn-1.

Moreover, as to the reset terminals R of the flip-flop F3 to Fn-2, the analog switches AR3 to ARn-2 are closed when the switching signal LRO is of high level, so as to supply, to the reset terminals R, an output from their next-stages, namely, flip-flops F4 to Fn-1, and are opened when the switching signal LRO is of low level. Meanwhile, the analog switch BR3 to BRn-2 are opened when the switching signal LRO is of high level, and is closed when the switching signal LRO is of low level, so as to supply, to the reset terminals R, an output from the output terminals Q of their preceding stages, namely the flip-flops F2 to Fn-3.

Furthermore, as to the set terminal S of the next flip-flop Fn-1, the analog switch ASn-1 is closed when the switching signal LRO is of high level, so as to supply, to the set terminal S, the output of the preceding flip-flop Fn-2, and is opened when the switching signal LRO is of low level. Meanwhile, the analog switch BSn-1 is opened when the switching signal LRO is of high level, and closed when the switching signal LRO is of low level, so as to supply the start pulse SPO to the set terminal S.

Moreover, as to the reset terminal R of the flip-flop Fn-1, the analog switch ARn-1 is closed when the switching signal LRO is of high level, so as to supply an output of the next flip-flop Fn to the reset terminal R, and is opened when the switching signal LRO is of low level. Meanwhile, the analog switch BRn-1 is opened when the switching signal LRO is of high level, and is closed when the switching signal LRO is of low level, so as to supply, to the reset terminal R, an output of the preceding flip-flop Fn-2.

Furthermore, as to the set terminal S of the last stage flip-flop Fn, the analog switch ASn is closed when the switching signal LRO is of high level, so as to supply, to the set terminal S, the output of the preceding flip-flop Fn-1, and is opened when the switching signal LRO is of low level. Meanwhile, the analog switch BSn is opened when the switching signal LRO is of high level, and is closed when the switching signal LRO is of low level, so as to ground the set terminal S.

Moreover, as to the reset terminal R of the flip-flop Fn, the analog switch ARn is closed when the switching signal LRO is of high level, so as to supply, to the reset terminal R, an output of the flip-flop Fn corresponding thereto, and is opened when the switching signal LRO is of low level. Meanwhile, the analog switch BRn is opened when the switching signal LRO is of high level, and is closed when the switching signal LRO is of low level, so as to supply the high level driving voltage Vcc to the reset terminal R.

Thus, the analog switches AS1 to ASn, and AR1 to ARn, and the analog switches BS1 to BSn, and BR1 to BRn are controlled reciprocally in accordance with the switching signal LRO. With this arrangement, it is possible to realize the two-way shift operations. In one of the two-way shift operations, the flip-flop F2 is the first stage, while the flip-flop Fn is the last stage, as described above, and the start pulse SPO is sequentially shifted from the flip-flops F2, F3, F4, . . . , to Fn, and the output signals S2, S3, . . . , and Sn are sequentially outputted in this order. In the other one of the two-way shifting operations, the flip-flop Fn-1 is the first stage, while the flip-flop F1 is the last stage, and the start pulse SPO is sequentially shifted from the flip-flops Fn-1, Fn-2, Fn-3, . . . , to F1, and the output signals Sn-1, Sn-2, . . . , and S1 are outputted in this order.

As to the set terminals S of the flip-flops F1 and Fn, it is not requisite that the ground level be supplied to the set terminals S. It is only required that the voltage to be supplied to the set terminals S have such a level as not to set the flip-flops F1 and Fn. Likewise, as to the reset terminals R thereof, it is not requisite that the driving voltage Vcc be supplied to the reset terminals R. It is only required that the voltage to be supplied to the reset terminals R have such a level as to reset the flip-flops F1 and Fn.

Further, in the shift register 51 having such arrangement, it should be noted that the shift register 51 is provided with an operation control circuit 54 for outputting an enable signal ENB. The enable signal ENB, inactivates the level shifter 13 in response to the output of the flip-flop from which the shift operation starts (in the shift register 51, the flip-flops F2 and Fn-1), and activates the level shifter 13 in accordance with output signals of the last flip-flops Fn and F1. The switching signal LRO is supplied to the operation control circuit 54, so as to control the output of the enable signal ENB in accordance with the shift directions. Specifically, when the shift operation is started from the flip-flop F2, the level shifter 13 is inactivated in response to the output signal S2 of the flip-flop F2. In response to the output signal Sn of the last flip-flop Fn, the level shifter 13 is activated. On the other hand, when the shift operation is started from the flip-flop Fn-1, the level shifter 13 is inactivated in response to the output signal Sn-1 of the flip-flop Fn-1, while the level shifter 13 is activated in response to the output signal S1 of the last flip-flop F1.

Figure 16:
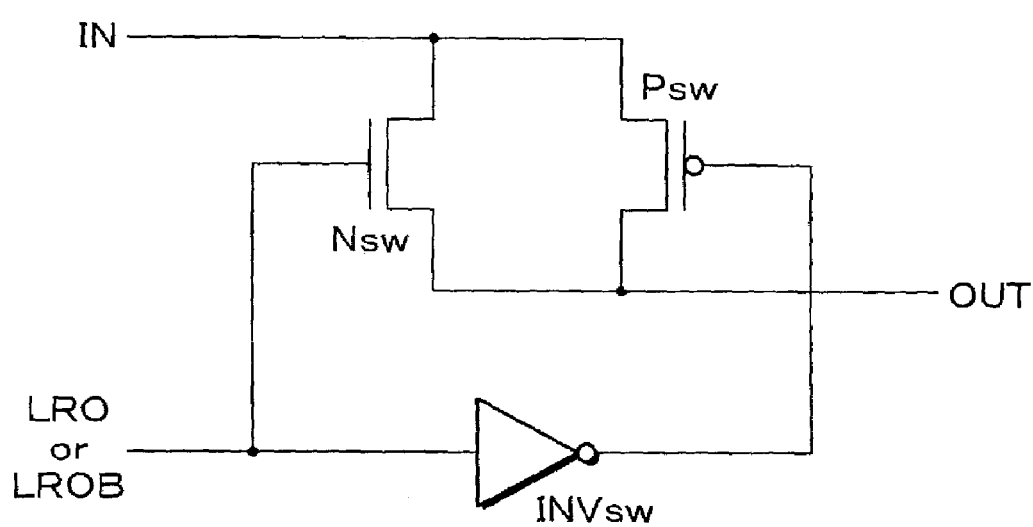
FIG. 16 is a block diagram illustrating an example arrangement of an analog switch in the shift register section shown in FIG. 15.

FIG. 16 is a block diagram showing an example arrangement of the analog switches AS and AR; BS and BR. The analog switches AS and AR, and BS and BR are composed of a pair of an NMOS transistor Nsw and a PMOS transistor Psw, and an inverter INVsw. The switching signal LRO or the switching signal LROB, which has been inverted by the inverter INV1r, are directly supplied to a gate of the NMOS transistor Nsw. Meanwhile the switching signal LRO or the switching signal LROB is also inverted by the inverter INVsw, and then supplied to a gate of the PMOS transistor Psw. Therefore, when the switching signals LRO and LROB are of high level, both the transistors Nsw and Psw are commonly turned ON, so as to allow an input signal IN of positive polarity and an input signal IN of negative polarity to pass and output the input signals IN as the output signals OUT. On the contrary, when the switching signals LRO and LROB are of low level, both the transistors Nsw and Psw are commonly turned OFF, so as to block the input signals IN, and thus not outputting the output signals OUT. Here, the switching signal LRO is supplied to the analog switches AS and AR, while the inverted switching signal LROB is supplied to the analog switches BS and BR, whereby reciprocal operations are performed as described above.

Figure 17:
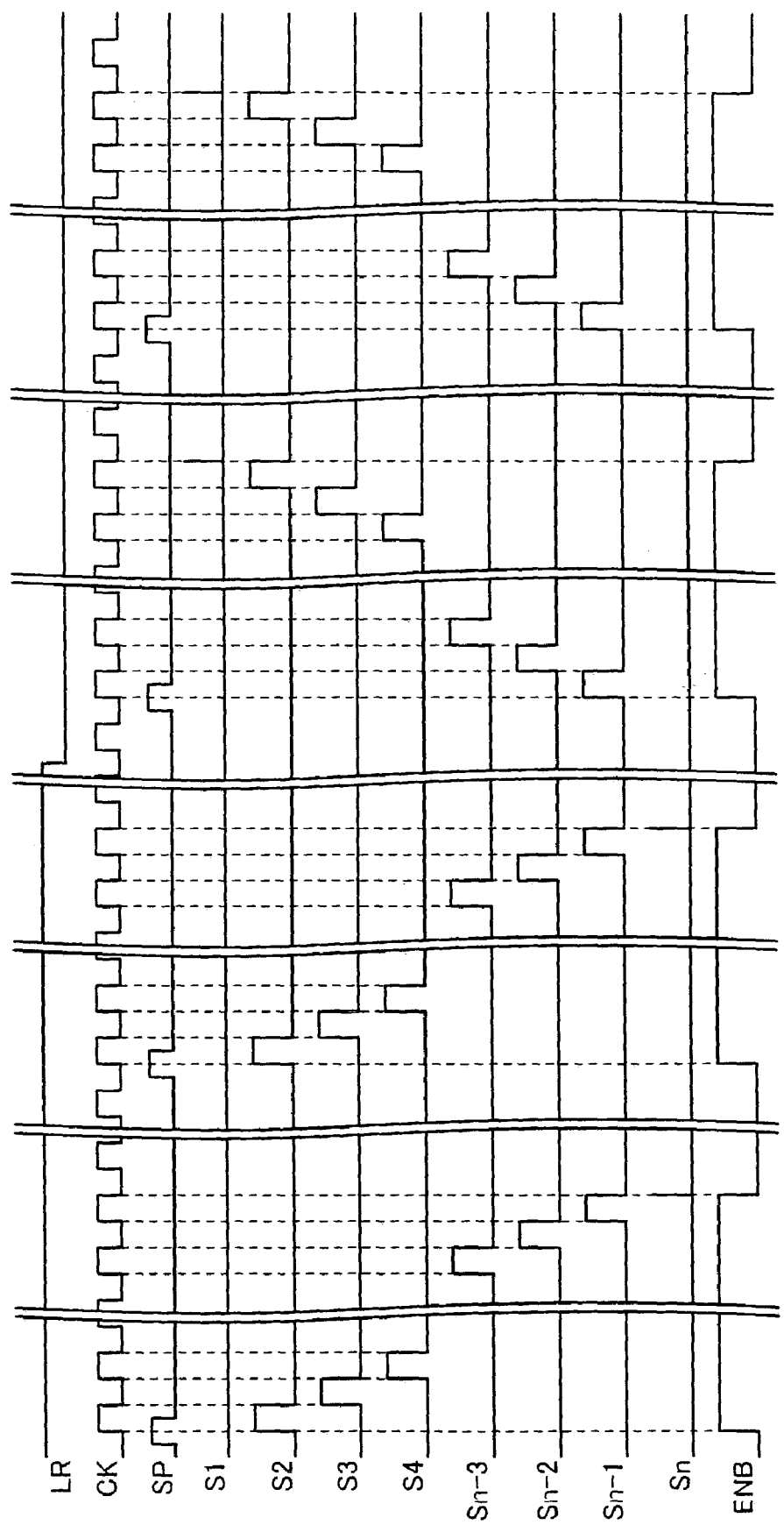
FIG. 17 is a waveform chart, which explains how the shift register shown in FIG. 14 operates.

FIG. 17 is a waveform chart for explaining the operation of the shift register 51 having the above arrangement. When the switching signal LR is of high level, the analog switches AS and AR are turned ON in accordance with the homopolar and boosted switching signal LRO, while the analog switches BS and BR are turned OFF in accordance with the switching signal LRO.

In this way, the start pulse SPO, which is generated by boosting the start pulse SP by the level shifter 13, is supplied to the set terminal S of the second stage flip-flop F2. Specifically, the flip-flop F2 is set in a rise timing of the clock signal CK, while the start pulse SPO is high level and active, and outputs the output signal S2 from an output terminal Q of the flip-flop F2.

The output signal S2 is supplied to the set terminal S of the next flip-flop F3. The flip-flop F3 is set in a timing at which a clock signal CKB rises, that is, in a fall timing of a clock signal CK, so that the output signal S3 is outputted from the output terminal Q. Likewise, the output signal S3 is supplied to the set terminal S of the following-stage of flip-flop F4, and also to the reset terminal R of the preceding stage flip-flop F2 so as to reset the operation of the flip-flop F2, thereby making the output signal S2 low level and inactive.

Likewise, the output signals S4 to Sn-1 are outputted from the output terminals Q of the flip-flops F4 to Fn-1, and supplied to the set terminals S of their following stages, namely, the flip-flops F5 to Fn, and to the reset terminals R of their preceding stages, namely, the flip-flops F3 to Fn-2. Further, the output signal Sn is outputted from the output terminal Q of the flip-flop Fn, and supplied to the reset terminal R of the preceding flip-flop Fn-1, and to the reset terminal R of the flip-flop Fn.

As described above, when the switching signal LR is of high level as shown in the left half of FIG. 17, the flip-flop F2, to which the start pulse SPO is supplied, is the stage from which the shift operation is started. Thus, the shift operation is sequentially carried out until the flip-flop Fn every half period of the clock signal CK, and the output signals S2 to Sn are outputted. Here, the output signal Sn from the last-stage is reset by the output of the flip-flop Fn right after outputted from the flip-flop Fn. Moreover, the flip-flop F1 does not contribute to the shift operation when the switching signal LR is of high level as described above, and is reset always. Therefore, the output signal S1 is kept to be of low level.

On the contrary, as shown in the right half of FIG. 17, when the switching signal LR is of low level, the analog switches AS and AR are turned OFF in accordance with the homopolar and boosted switching signal LRO, while the analog switches BS and BR are turned ON in accordance with the switching signal LRO. In this way, the start pulse SPO, which is generated by boosting the start pulse SP by the level shifter 13, is supplied to a set terminal S of the n-1th stage flip-flop Fn-1. Detailed explanation on operation of the following flip-flops Fn-2 to F1 are omitted here. But in brief, the shift operation is started from the flip-flop Fn-1, and sequentially continued until the last flip-flop F1, whereby output signals Sn-1 to S1 are sequentially outputted each half period of the clock signal CK. Here, similarly to the above arrangement, the output signal S1 of the last stage is reset right after the output signal S1 is outputted. Moreover, the flip-flop Fn makes no contribution to the shift operation when the switching signal LR are low level, and is always reset, whereby the output signal Sn thereof is kept low level.

Even though, as described above, the output signals S2 to Sn-1 are effective as the output of the shift register 51, the output signal Sn or S1 from the last stage is used for the operation control of the level shifter 13 by the later-discussed operation control circuit 54. In this case, as shown in FIG. 17, the switching signal LR is of high level, the enable signal ENB is inactive and high level upon the outputting of the output signal S2 of the flip-flop F2, from which the shift operation is started. Upon the outputting of the output signal Sn of the last-stage flip-flop Fn, the enable signal ENB is active and low level. On the other hand, when the switching signal LR is of low level, the enable signal ENB is inactive and high level upon the outputting of the output signal Sn-1 of the flip-flop Fn-1, from which the shift operation is started, while the enable signal ENB is active and low level upon the outputting of the output signal S1 of the last-stage flip-flop F1.

Figure 18:
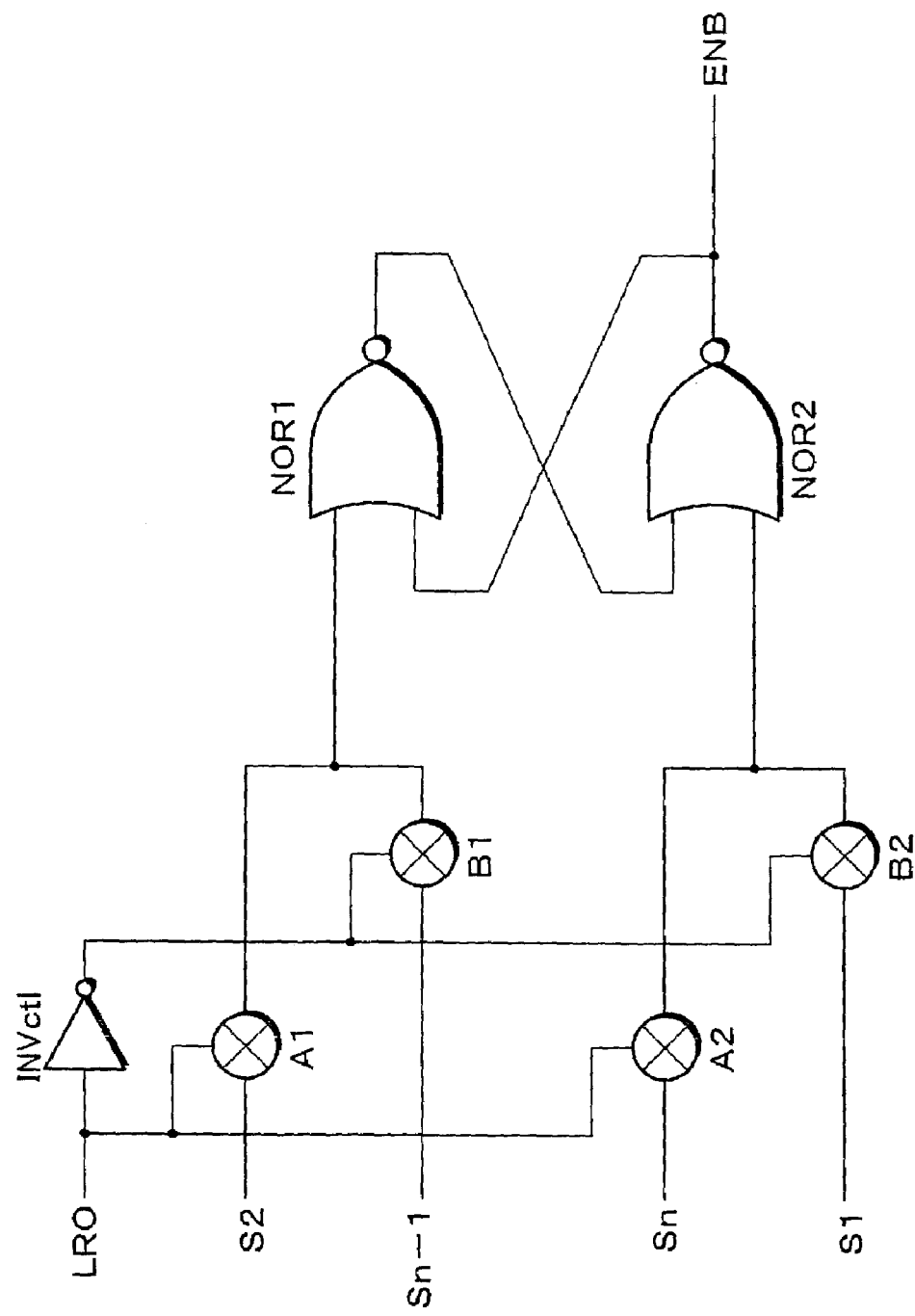
FIG. 18 is a block diagram illustrating an example arrangement of an operation control circuit of the shift register shown in FIG. 14.

FIG. 18 is a block diagram illustrating an example arrangement of the operation control circuit 54. The operation control circuit 54 is provided with a set/reset flip-flop composed of two inverting OR circuits NOR1 and NOR2 having a CMOS structure, and analog switches A1 and A2, and B1 and B2, and inverter INVct1. The set/reset flip-flop is described previously, and the analog switches A1 and A2, and B1 and B2 are structurally similar to the previously-discussed analog switches AS and AR, and BS and BR.

The analog switches A1 and A2, which operate similarly to the analog switches AS and AR, are closed when the switching signal LRO is of high level, and opened when the switching signal LRO is of low level. On the other hand, the analog switches B1 and B2, to which the switching signal LRO inverted by the inverter INVct1 is supplied, operate similarly to the analog switches BS and BR, thus are closed when the switching signal LRO is of low level and opened when the switching signal LRO is of high level.

Meanwhile the output signal S1 is supplied in the operation control circuit 14 shown in FIG. 4, the operation control circuit 54 is so arranged that the output signal S2 or Sn-1 is supplied to one of input terminals of the inverting OR circuit NOR1, and the output signal Sn or S1 is supplied to one of input terminals of the inverting OR circuit NOR2.

When the switching signal LRO is of high level, the output signal S2 is supplied, via the analog switch A1, to the one of the input terminals of the inverting OR circuit NOR1, and the output signal Sn is supplied, via the analog switch A2, to the one of the input terminals of the inverting OR circuit NOR2. To the other ones of the input terminals of the inverting OR circuits NOR1 and NOR2, the outputs of the counterpart inverting OR circuit are supplied respectively. That is, to the other one of the input terminal of the inverting OR circuit NOR1, the output of the inverting OR circuit NOR2 is supplied, and vice versa.

Therefore, the enable signal ENB, which is the output of the inverting OR circuit NOR2, becomes inactive and high level, as described above upon the outputting of the output signal S2, because at this time the output of the inverting OR circuit NOR1, that is, the input to the other one of the input terminals of inverting OR circuit NOR2, is low level and the output signal Sn is low level. Thereafter, even if the output signal S2 becomes low level, the output of the inverting OR circuit NOR1 is kept low level, the output of the inverting OR circuit NOR2, that is, the enable signal ENB is kept high level, in accordance with the high level output of the inverting OR circuit NOR2.

Thereafter, when the output signal Sn is outputted, the enable signal ENB, which is the output of the inverting OR circuit NOR2, becomes active and low level. In accordance with this, the two input terminals of the inverting OR circuit NOR1 become low level, whereby the output of the inverting OR circuit NOR1 becomes high level. After that, even if the output signal Sn becomes low level, the output of the inverting OR circuit NOR2, that is, the enable signal ENB, in accordance with the high level output of the inverting OR circuit NOR1, is kept low level until the output signal S2 is outputted again.

On the contrary, when the switching signal LRO is of low level, the output signal Sn-1 is supplied, via the analog switch B1, to the one of the input terminals of the inverting OR circuit NOR1, while the output signal S1 is supplied, via the analog switch B2, to the one of the input terminals of the inverting OR circuit NOR2.

Therefore, the enable signal ENB, which is the output of the inverting OR circuit NOR2, becomes inactive and high level as described above upon the outputting of the output signal Sn-1 because at this time the output of the inverting OR circuit NOR1, that is, the input to the other one of the input terminals of the inverting OR circuit NOR2 is low level and the output signal S1 is low level. After that, even if the output signal Sn-1 becomes low level, the output of the inverting OR circuit NOR1 is kept low level, and the output of the inverting OR circuit NOR2, that is, the enable signal ENB is kept high level, in accordance with the high level output of the inverting OR circuit NOR2.

Thereafter, when the output signal S1 is outputted, the enable signal ENB, which is the output of the inverting OR circuit NOR2, becomes active and low level, whereby both of the inputs of the inverting OR circuit NOR1 are low level. Thereby, the output of the inverting OR circuit NOR1 becomes high level. After that, even if the output signal S1 becomes low level, the output of the inverting OR circuit NOR2, that is, the enable signal ENB, in accordance with the high level output of the inverting OR circuit NOR1, is kept low level until the output signal Sn-1 is outputted again.

In this way, it is possible to carry out the operation control of the level shifter 13 with respect to the two-way shift operation. In recent years, apparatuses such as monitor panels of video cameras and digital cameras typically, which are capable of displaying a mirror image inverted bottom up or right to left in accordance with a direction in which their image display section faces. When the two-way shift register 51, which is capable of switching shifting direction of data, is used as a shift register for use in such display apparatuses capable of inverting its display image, it is possible to display the mirror image simply by switching the shift direction. This allows to eliminate a means for storing a video signal.

In this case, in the image display apparatus 21 shown in FIG. 6, the switching signal LR is additionally supplied to the shift register 26a from the control circuit 23 for generating the video signal DAT. This realizes the display of an image inverted right to left. Moreover, the display of an image inverted bottom up is realized by additionally inputting a similar switching signal UD to the shift register 25a from the control circuit 23.

Described below is still yet another embodiment of the present invention, with reference to FIGS. 19 to 21.

Figure 19:
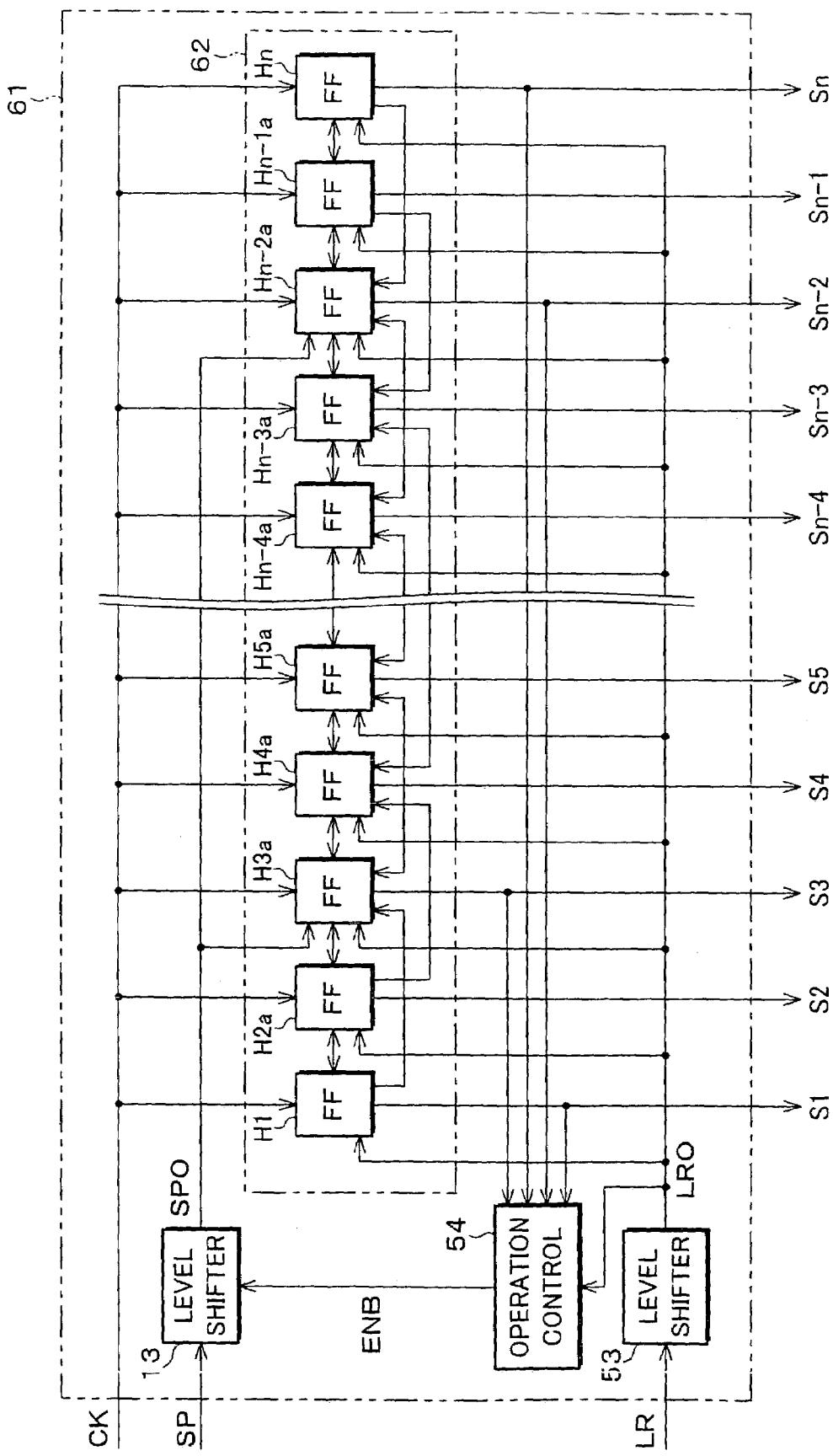
FIG. 19 is a block diagram showing an electric configuration of a shift register of still yet another embodiment of the present invention.

FIG. 19 is a block diagram illustrating an electric configuration of a shift register 61 of the still yet another embodiment of the present invention. The shift register 61 is similar to the shift register 51. Thus, corresponding sections in the shift register 61 are labeled in the same fashion as in the shift register 51, while the same numeral references are labeled with the reference characters "a", and their explanation is omitted here. It should be noted in the shift register 61 that in a shift register section 62, flip-flop circuits to firstly receive a start pulse SPO are third stages, that is, a flip-flop circuits H3a and Hn-2a in which s=3. It should also be noted in the shift register 61 that a stage before one preceding stage is reset, on contrary to the shift register 51 in which the preceding stage is reset. Taking the flip-flop H5a as an example, when the flip-flop circuit H5a outputs the output signal S5, in the shift register 51, the preceding flip-flop circuit H4a is reset, while in the shift register 61, the flip-flop circuit H3a, which is the flip-flop before the preceding flip-flop circuit (that is, which is preceded by two flip-flops) from the flip-flop H5a, is reset from the flip-flop H5a).

Therefore, in the operation control circuit 54, having the similar arrangement and operating similarly, output signals to be supplied to analog switches A1 and B1 are S3 and Sn-2, while in FIG. 18 the corresponding output signals are S2 and Sn-1.

Figure 20:
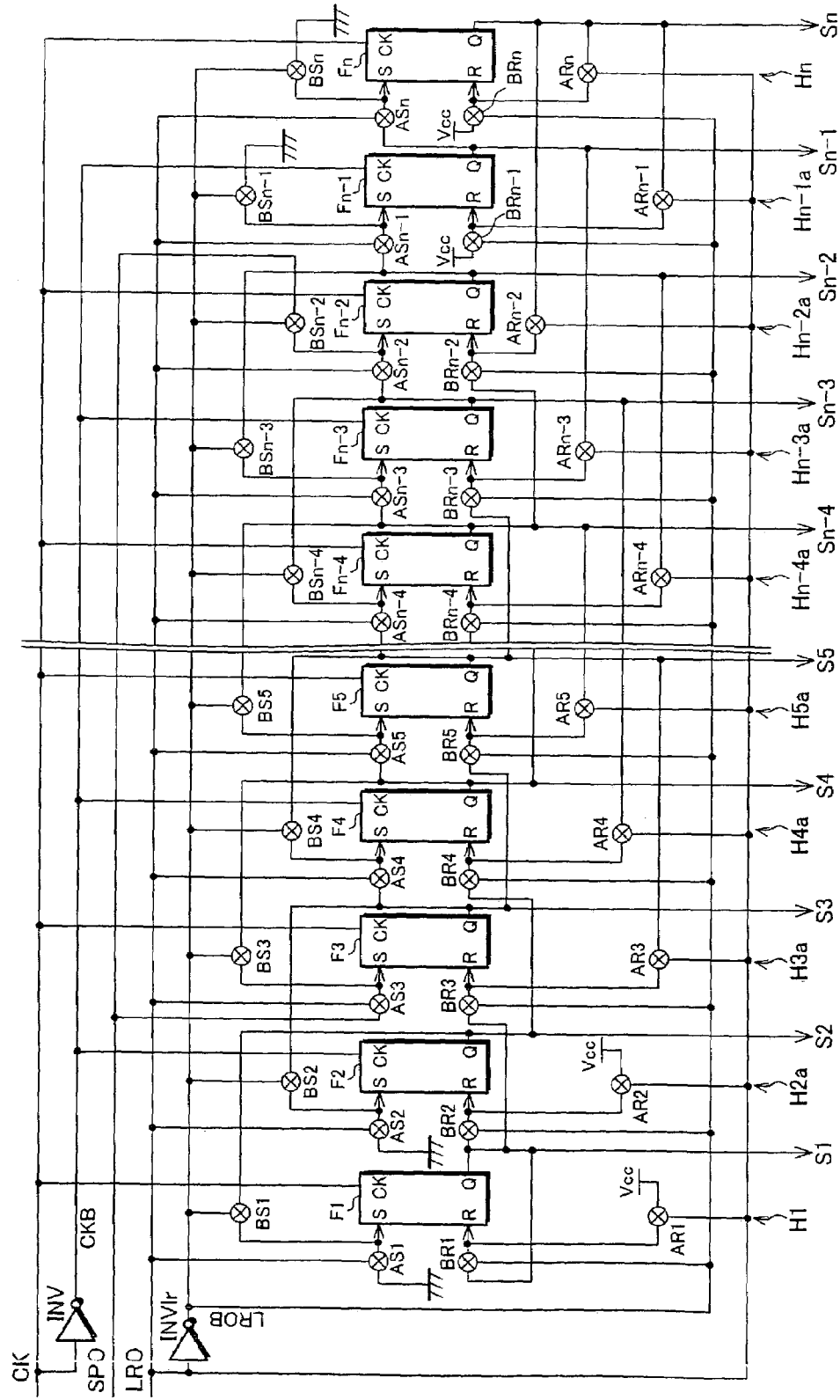
FIG. 20 is a block diagram illustrating in detail an example arrangement of a shift register section in the shift register shown in FIG. 19.
Figure 21:
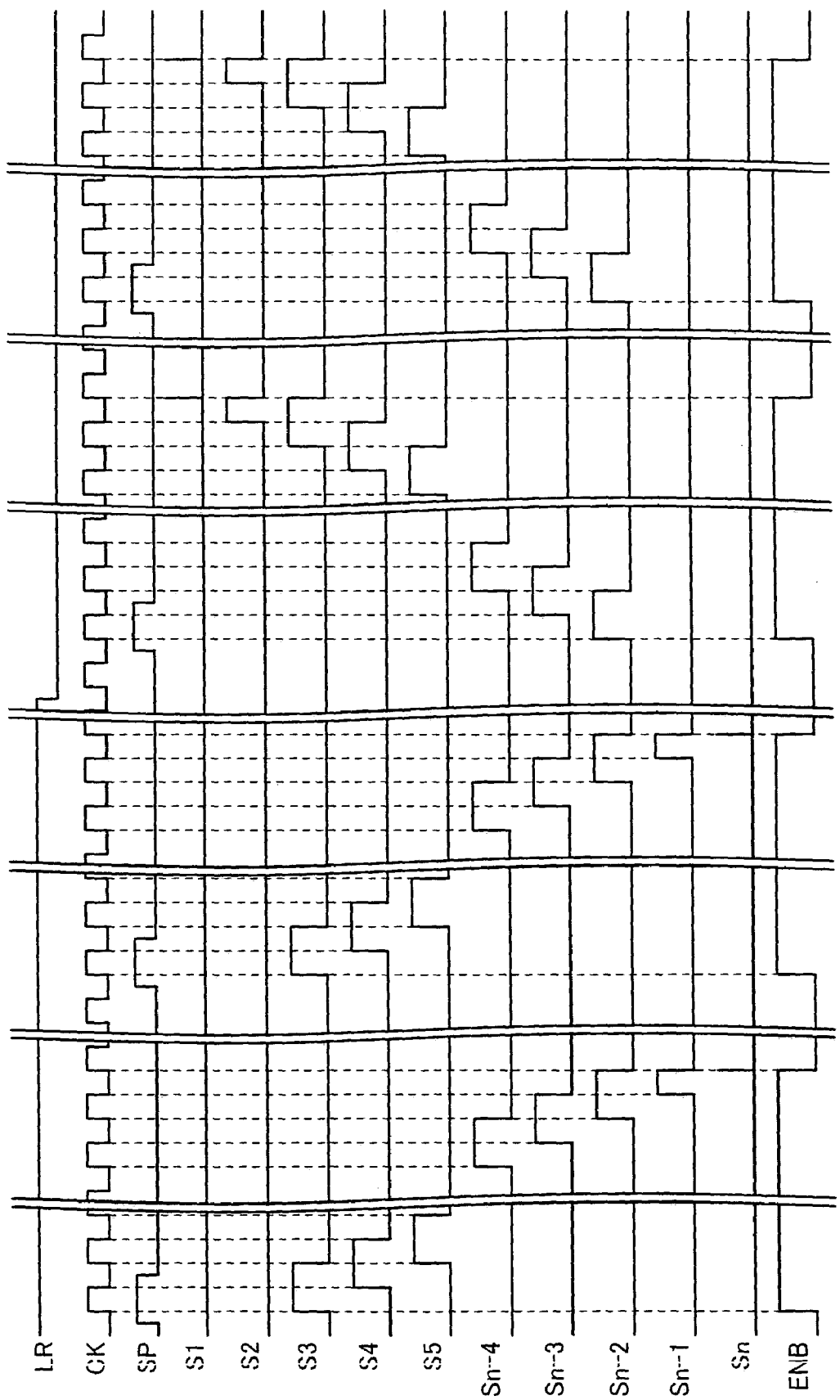
FIG. 21 is a waveform chart, which explains how the shift register shown in FIG. 19 operates.

FIG. 20 is a block diagram illustrating in detail an example arrangement of the shift register section 62. In FIG. 20, sections corresponding to those shown in FIG. 15 are labeled with the identical reference numerals or with the identical reference numerals attached with a additional reference mark "a". In the shift register section 62, an arrangement regarding the flip-flops F1 and Fn are similar to those in the shift register section 52. However, an arrangement regarding the rest of flip-flops, namely flip-flops F2 to Fn-1 in FIG. 20 is different from that in the shift register section 52.

Specifically, the flip-flop F2 is configured similarly to the flip-flop F1. As to a set terminal S of the flip-flop F2, an analog switch AS2 is closed when the switching signal LRO is of high level, so as to ground the set terminal S, and is opened when the switching signal LRO is of low level. On the contrary, an analog switch BS2 is opened when the switching signal LRO is of high level, and is closed when the switching signal LRO is of low level, so as to connect the set terminal S to an output terminal Q of the next flip-flop F3.

Moreover, as to a reset terminal R of the flip-flop F2, an analog switch AR2 is closed when the switching signal LRO is of high level, so as to supply a high level driving voltage Vcc to the reset terminal R, and is opened when the switching signal LRO is of low level. On the contrary, an analog switch BR2 is opened when the switching signal LRO is of high level, and is closed when the switching signal LRO is of low level, so as to supply an output of the preceding flip-flop F1 to the reset terminal R, and reset the flip-flop F2.

As to a set terminal S of the next flip-flop F3, an analog switch AS3 is closed when the switching signal LRO is of high level, so as to supply the start pulse SPO to the set terminal S, and is opened when the switching signal LRO is of low level. On the contrary, an analog switch BS3 is opened when the switching signal LRO is of high level, and is closed when the switching signal LRO is of low level, so as to connect the set terminal S to an output terminal Q of the next flip-flop F4.

Moreover, as to a reset terminal R of the flip-flop F3, an analog switch AR3 is closed when the switching signal LRO is of high level, so as to supply to the reset terminal R an output from an output terminal Q of the flip-flop F5, which is the stage after the next stage to the flip-flop F3, and is opened when the switching signal LRO is of low level. On the contrary, the analog switch BR3 is opened when the switching signal LRO is of high level, and is closed when the switching signal LRO is of low level, so as to supply to the reset terminal R an output from an output terminal Q from the flip-flop F1, which is the stage before the preceding stage, and to reset the flip-flop F3.

As to set terminals S of the following flip-flops F4 to Fn-3, analog switches AS4 to ASn-3 are closed when the switching signal LRO is of high level, so as to supply outputs of their preceding stages, namely, the flip-flops F3 to Fn-4, and is opened when the switching signal LRO is of low level. On the contrary, analog switches BS 4 to BSn-3 are opened when the switching signal LRO is of high level, and is closed when the switching signal LRO is of low level, so as to supply, to the set terminals S, outputs of their next stages, namely, the flip-flops F5 to Fn-2.

Furthermore, as to reset terminals R of the flip-flops F4 to Fn-3, analog switches AR4 to ARn-3 are closed when the switching signal LRO is of high level, so as to supply, to the reset terminals R, outputs of the stage after the next stage to the flip-flops F4 to Fn-3, that is, the flip-flops F6 to Fn-1, and is opened when the switching signal LRO is of low level. On the contrary, analog switches BR4 to BRn-3 are opened when the switching signal LRO is of high level, and is closed when the switching signal LRO is of low level, so as to supply, to the reset terminals R, outputs of output terminals Q of the stage before the preceding stage to the flip-flops F4 to Fn-3, that is, the flip-flops F2 to Fn-5.

Further, as to a set terminal S of the next flip-flop Fn-2, an analog switch ASn-2 is closed when the switching signal LRO is of high level, so as to supply, to the set terminal S, an output of the preceding flip-flop Fn-3, and is opened when the switching signal LRO is of low level. On the contrary, an analog switch BSn-2 is opened when the switching signal LRO is of high level, and is closed when the switching signal LRO is of low level, so as to supply the start pulse SPO to the set terminal S.

Moreover, as to a reset terminal R of the flip-flop Fn-2, an analog switch ARn-2 is closed when the switching signal LRO is of high level, so as to supply to the reset terminal R an output of the stage after the next stage, that is, the flip-flop Fn, and is opened when the switching signal LRO is of low level. On the contrary, an analog switch BRn-2 is opened when the switching signal LRO is of high level, and is closed when the switching signal LRO is of low level, so as to supply to the reset terminal R an output of the stage before the preceding stage, that is, the flip-flop Fn-4.

Furthermore, the next flip-flop Fn-1 has a similar arrangement to that of the last flip-flop Fn. Thus, as to a set terminal S, an analog switch ASn-1 is closed when the switching signal LRO is of high level, so as to supply to the set terminal S an output of the preceding flip-flop Fn-2, and is opened when the switching signal LRO is of low level. On the contrary, as to an analog switch BSn-1 is opened when the switching signal LRO is of high level, and is closed when the switching signal LRO is of low level, so as to ground the set terminal S.

Moreover, as to a reset terminal R of the flip-flop Fn-1, an analog switch ARn-1 is closed when the switching signal LRO is of high level, so as to supply, to the reset terminal R, an output of the next flip-flop Fn, and is opened when the switching signal LRO is of low level. On the other hand, an analog switch BRn-1 is opened when the switching signal LRO is of high level, and is closed when the switching signal LRO is of low level, so as to supply the high-level driving voltage Vcc to the reset terminal R.

Therefore, the analog switches AS1 to ASn, and AR1 to ARn and the analog switches BS1 to BSn and BR1 to BRn are controlled reciprocally in accordance with the switching signal LRO. With this arrangement, it is possible to realize such two-way shift operations as shown in FIG. 21; in one of the two-way shift operations the flip-flop F3 is the first stage while the flip-flop Fn is the last stage so that, as described above, the start pulse SPO is sequentially shifted from the flip-flops F3, F4, F5, . . . , and Fn in synchronism of a clock signal CK whereby the output signals S3, S4, . . . , and Sn are outputted in this order while in the other one of the two way shift operations the flip-flop Fn-2 is the first stage, and the flip-flop F1 is the last stage so that the start pulse SPO is sequentially shifted from the flip-flop Fn-2, Fn-3, Fn-4, . . . , and F1, whereby the output signals Sn-2, Sn-3, . . . , and S1 are outputted in this order.

Moreover, it is possible to have, among the output signals S3 to Sn-2, a pulse width equivalent to one cycle of the clock signal CK, that is a pulse width two times longer than that in FIG. 17, because the resetting is carried out in accordance with the output signals of the flip-flop before the preceding flip-flop or the flip-flop after the following flip-flop. Not limited to such pulse width larger by two times, it may be so arranged as to have a pulse width larger by three times or more, depending on time required for writing the image signal DAT in each pixel PIX.

On the other hand, when the switching signal LR is of high level, the output signals S1 and S2 are maintained to be low level, because the flip-flops F1 and F2 are reset. Meanwhile, the output signals Sn-1 and Sn have different output pulse waveforms from the other output signals, as the flip-flops Fn-1 and Fn are reset in accordance with the output signal Sn. Similarly, when the switching signal LR is of low level, the output signals Sn and Sn-1 are kept low level, so that the output signals S2 and S1 have different pulse waveforms from the other output signals.

Described below is a further embodiment of the present invention, referring to FIG. 22.

Figure 22:
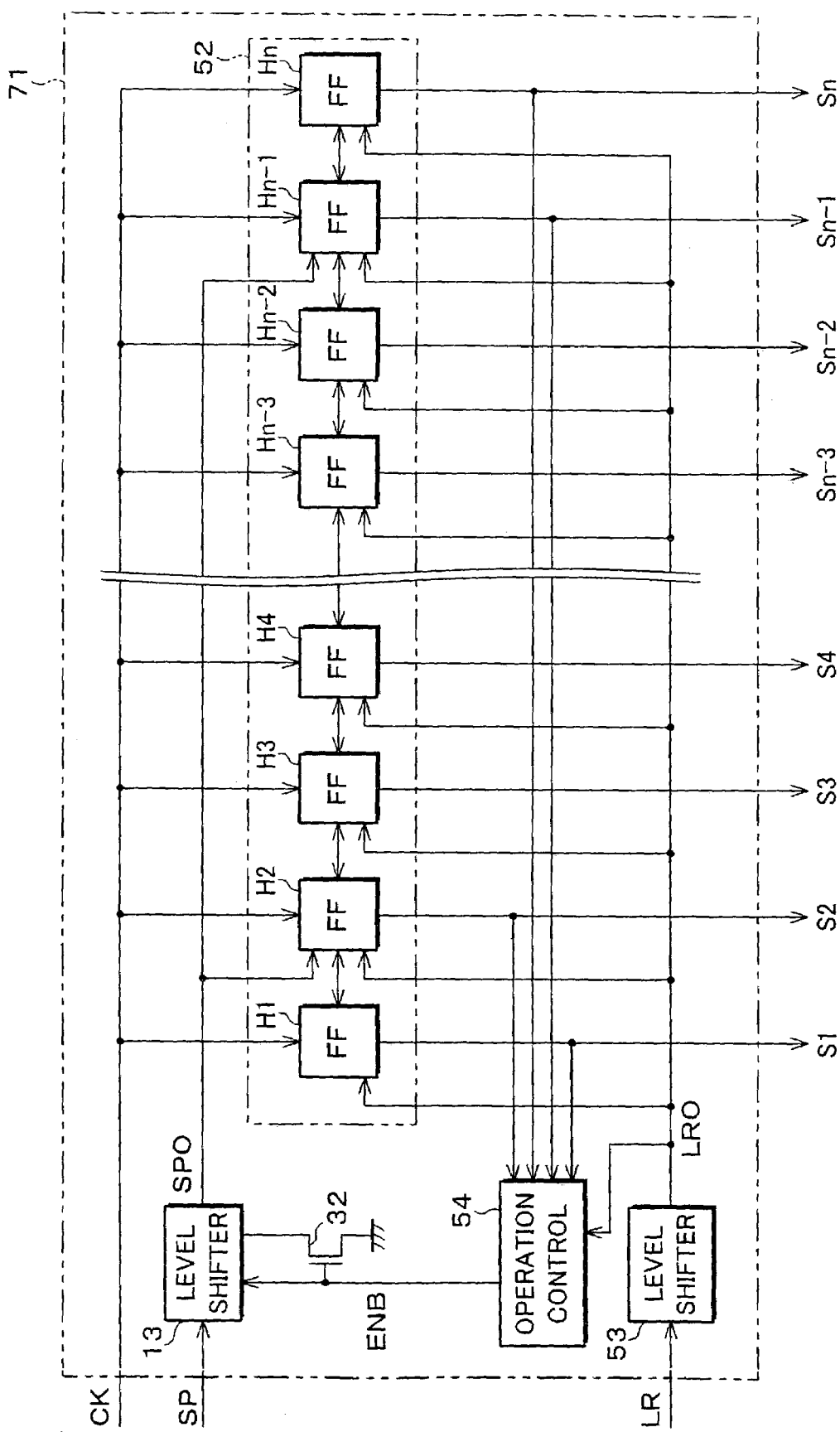
FIG. 22 is a block diagram showing an electric configuration of a shift register of a further embodiment of the present invention.

FIG. 22 is a block diagram illustrating an electric configuration of a shift register 71 of the further embodiment of the present invention. The shift register 71 is similar to the shift registers 31 and 51. Thus, corresponding sections in the shift register 71 are labeled in the sama manner, and their explanation is omitted here. It should be noted that the shift register 71 is provided with an input control circuit 32. In response with an enable signal ENB, the input control circuit 32 supplies, to an input of an input switching element of a level shifter section 13a, a signal having such a level as to open, when an operation control circuit 54 inactivates a level shifter 13.

With this arrangement, it is possible to realize inactivation of the level shifter 13 of the current driving type, and reduction in a current of an NMOS transistor N2, which is the input switching element for use in the inactivation.

Figure 23:
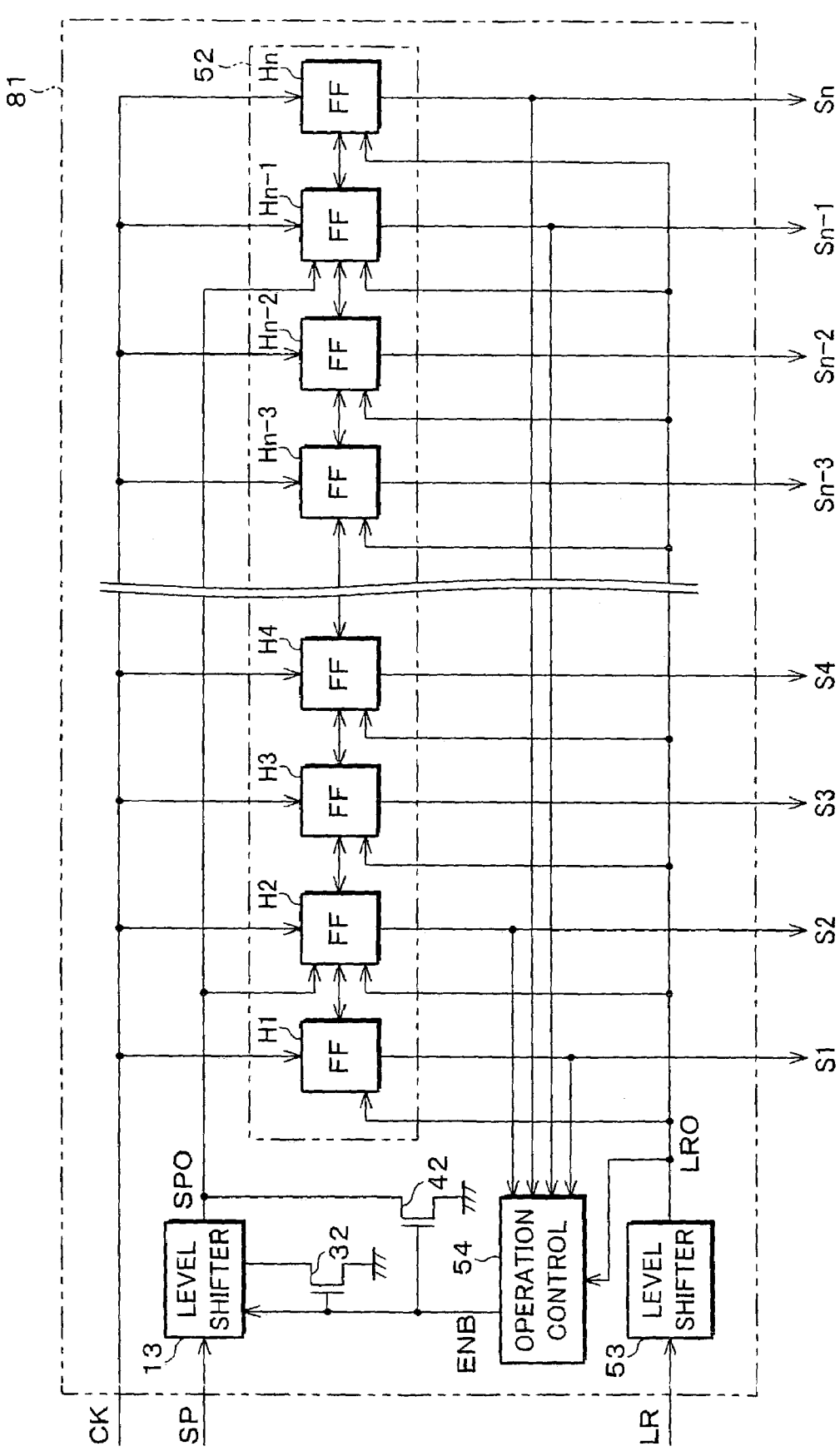
FIG. 23 is a block diagram illustrating an electric configuration of a shift register of a still further embodiment of the present invention.

Referring to FIG. 23, described below is a still further embodiment of the present invention.

FIG. 23 is a block diagram of an electric configuration of a shift register 81 of the still further embodiment of the present invention. The shift register 81 is similar to the shift registers 41 and 51. Therefore, the shift register 81 is provided with, besides an input control circuit 32, an output stabilizing circuit 42 for maintaining, in response to an enable signal ENB, an output voltage of a level shifter section 13a to a predetermined value when an operation control circuit 54 inactivates a level shifter 13.

With this arrangement, it is possible to maintain the output voltage of the level shifter 13 to the predetermined value and prevent erroneous operation of the flip-flops F2 and Fn-1, while the level shifter 13 is inactivated. Thus, it is possible to realize a more stable shift register.

Needless to say, in the shift registers 71 and 81, it may be so arranged as to use the shift register section 62 of the shift register 61 or other shift register sections in which s≧4, instead of the shift register sections 52.

Moreover, discussed in the above are the cases in which the image display apparatus 21 is used as application of the shift registers 11, 31, 41, 51, 61, 71, and 81. However, it is possible to use the shift registers 11, 31, 41, 51, 61, 71, and 81 for any other applications in which an input signal having an amplitude lower than those of the driving voltages Vcc of those shift registers. In the image display apparatus 21, it is highly demanded to have better resolution and wider display area. Thus, in most cases, the shift registers 11, 31, 41, 51, 61, 71, and 81 tend to have a large number of stages, and it is hard to secure sufficient driving capacity of the level shifter 13. Therefore, it is quite effective to apply the shift registers 11, 31, 41, 51, 61, 71, and 81 in the image display apparatus 21.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A shift register including plural stages of flip-flops for sequentially transmitting therethrough an input signal supplied thereto, comprising:
   a level shifter for boosting the input signal, which has an amplitude lower than that of a driving voltage of the flip-flops, and supplying the thus boosted input signal to the first stage flip-flop; and
   an operation control means for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where x and y are arbitrary integers and x<y.

2. The shift register as set forth in claim 1, wherein:
   the x-th stage flip-flop is the first stage flip-flop, and the y-th stage flip-flop is the last stage flip-flop.

3. The shift register as set forth in claim 1, wherein:
   the level shifter includes a level shifter section of a current driving type having an input switching element for receiving the input signal and being closed always throughout operation of the level shifter.

4. A shift register as set forth in claim 3, further comprising:
   an input control means for supplying, when the operation control means turns OFF the level shifter, a signal to an input terminal of the input switching element of the level shift section, the signal having such a level as to open the input switching element.

5. The shift register as set forth in claim 4, wherein the input control means comprises a MOS transistor including a gate supplied with an output of the operation control means.

6. The shift register as set forth in claim 1, wherein:
   the level shifter includes an output stabilizing section for maintaining an output voltage to a predetermined value when the level shifter is turned OFF.

7. The shift register as set forth in claim 6, wherein the output stabilizing section comprises a MOS transistor connected between an output of the level shifter and a specified voltage and including a gate supplied with an output of the operation control means.

8. A shift register including plural stages of flip-flops for sequentially transmitting therethrough an input signal supplied thereto and being switchable in shift directions, comprising:
   a level shifter for boosting the input signal, which has an amplitude lower than that of a driving voltage of the flip-flops, and supplying the thus boosted input signal to the s-th stage flip-flop; and
   an operation control means for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where s, x and y are arbitrary integers and s≦x<y.

9. The shift register as set forth in claim 8, wherein:
   the x-th stage flip-flop is the s-th stage flip-flop, and the y-th stage flip-flop is the last stage flip-flip.

10. The shift register as set forth in claim 8, wherein:
    the level shifter includes a level shifter section of a current driving type having an input switching element for receiving the input signal and being closed always throughout operation of the level shifter.

11. A shift register as set forth in claim 10, further comprising:
    an input control means for supplying, when the operation control means turns OFF the level shifter, a signal to an input terminal of the input switching element of the level shift section, the signal having such a level as to open the input switching element.

12. The shift register as set forth in claim 8, wherein:
    the level shifter includes an output stabilizing section for maintaining an output voltage to a predetermined value when the level shifter is turned OFF.

13. A display apparatus, comprising:
    scanning signal lines and data signal lines crossing each other; and
    a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines,
    wherein at least one of the scanning signal line driving circuit and the data signal line driving circuit is integrally provided on a display panel, and includes a shift register having plural stages of flip-flops for sequentially transmitting therethrough an input signal supplied thereto, and
    the shift register further includes:
      a level shifter for boosting the input signal, which has an amplitude lower than that of a driving voltage of the flip-flops, and for supplying the thus boosted input signal to the first stage flip-flop; and
      an operation control means for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where x and y are arbitrary integers and x<y.

14. A display apparatus, comprising:
    scanning signal lines and data signal lines crossing each other; and
    a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines,
    wherein at least one of the scanning signal line driving circuit and the data signal line driving circuit is integrally provided on a display panel, and includes a shift register having plural stages of flip-flops for sequentially transmitting therethrough an input signal supplied thereto and being switchable in shift directions, and
    the shift register further includes:
      a level shifter for boosting the input signal, which has an amplitude lower than that of a driving voltage of the flip-flops, and for supplying the thus boosted input signal to the s-th stage flip-flop; and
      an operation control means for, in response to outputs of the x-th stage flip-flop and the y-th stage flip-flop, turning OFF the level shifter when the input signal is transmitted by the x-th stage flip-flop, and turning ON the level shifter when the input signal is transmitted by the y-th stage flip-flop, where s, x and y are arbitrary integers, and s≦x<y.

15. A shift register comprising:
a level shifter for converting a voltage amplitude of a signal supplied thereto, and outputting the signal;
plural stages of flip-flops for sequentially transmitting, from (i) a stage of flip-flop that is predetermined to (ii) the last stage flip flop, the signal outputted from the level shifter; and
an operation control circuit for turning ON and OFF the level shifter in accordance with respective outputs of two of the flip-flops that are predetermined.

16. The shift register as set forth in claim 15, wherein:
the two of the flip-flops that are predetermined are respectively (i) the stage of flip-flop that is predetermined, and (ii) the last stage flip flop.

17. A shift register comprising:
a level shifter for converting a voltage amplitude of a signal supplied thereto, and outputting the signal;
plural stages of flip-flops for sequentially transmitting therethrough the signal outputted from the level shifter; and
an operation control circuit for, in response to outputs of the x-th stage flip-flop and the y-th stage flip-flop of the flip-flops, turning OFF the level shifter when the input signal is transmitted by the x-th stage flip-flop, and turning ON the level shifter when the input signal is transmitted by the y-th stage flip-flop, where x and y are arbitrary integers and x<y.

18. The shift register as set forth in claim 17, wherein:
the x-th stage flip-flop is the first stage flip-flop, and the y-th stage flip-flop is the last stage flip-flop.

19. The shift register as set forth in claim 17, wherein the operation control means comprises one or more flip-flops.

20. The shift register as set forth in claim 17, wherein the operation control means comprises an arrangement of logic circuits.

21. A shift register comprising:
a level shifter for converting a voltage amplitude of a signal supplied thereto, and outputting the signal;
plural stages of flip-flops capable of sequentially transmitting therethrough the signal outputted from the level shifter, and of switching over shift directions thereof, wherein the signal outputted from the level shifter is supplied to the s-th stage flip-flop of the flip-flops; and
an operation control circuit for, in response to outputs of the x-th stage flip-flop and the y-th stage flip-flop of the flip-flops, turning OFF the level shifter when the input signal is transmitted by the x-th stage flip-flop, and turning ON the level shifter when the input signal is transmitted by the y-th stage flip-flop,
where s, x and y are arbitrary integers, $s \leqq x<y$, and, the s-th, x-th and y-th stage flip-flops are counted according to the shift directions.

22. The shift register as set forth in claim 21, wherein:
the x-th stage is the s-th stage, and the y-th stage is the last stage.

23. The shift register as set forth in claim 21, wherein the operation control means comprises an arrangement of logic circuits and one or more analog switches.

24. The shift register as set forth in claim 21, further comprising:
one or more switches coupled to set terminals of the flip-flops.

25. The shift register as set forth in claim 21, further comprising:
first and second analog switches coupled to a set terminal of each of the flip-flops, the first analog switch receiving a switching signal and the second analog switch receiving an inverse of the switching signal.

26. The shift register as set forth in claim 25, further comprising:
another level shifter for level-shifting an input switching signal used to generate the switching signal supplied to the first analog switches and the inverse of the switching signal supplied to the second analog switches.

27. A display apparatus, comprising:
scanning signal lines and data signal lines crossing each other; and
a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines,
wherein at least one of the scanning signal line driving circuit and the data signal line driving circuit includes a shift register, and
the shift register includes:
a level shifter for converting a voltage amplitude of a signal supplied thereto, and outputting the signal;
plural stages of flip-flops for sequentially transmitting from a stage of flip-flops that is predetermined, the signal outputted from the level shifter; and
an operation control circuit for turning ON and OFF the level shifter in accordance with respective outputs of two of the flip-flops that are predetermined.

28. A display apparatus, comprising:
scanning signal lines and data signal lines crossing each other; and
a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines,
wherein at least one of the scanning signal line driving circuit and the data signal line driving circuit includes a shift register, and
the shift register includes:
a level shifter for converting a voltage amplitude of a signal supplied thereto, and outputting the signal;
plural stages of flip-flops for sequentially transmitting therethrough the signal outputted from the level shifter; and
an operation control circuit for, in response to outputs of the x-th stage flip-flop and the y-th stage flip-flop of the flip-flops, turning OFF the level shifter when the input signal is transmitted by the x-th stage flip-flop, and turning ON the level shifter when the input signal is transmitted by the y-th stage flip-flop, where x and y are arbitrary integers and x<y.

29. A display apparatus, comprising:
scanning signal lines and data signal lines crossing each other; and
a scanning signal line driving circuit and a data signal line driving circuit for writing in a video signal in pixel areas, respectively via the scanning signal lines and the data signal lines, so as to perform image display, the pixel areas being sectored by the scanning signal lines and data signal lines,
wherein at least one of the scanning signal line driving circuit and the data signal line driving circuit includes a shift register,
the shift register includes:

a level shifter for converting a voltage amplitude of a signal supplied thereto, and outputting the signal;

plural stages of flip-flops capable of sequentially transmitting therethrough the signal outputted from the level shifter, and of switching over shift directions thereof, wherein the signal outputted from the level shifter is supplied to the s-th stage flip-flop of the flip-flops; and an operation control circuit for, in response to outputs of the x-th stage flip-flop and the y-th stage flip-flop of the flip-flops, turning OFF the level shifter when the input signal is transmitted by the x-th stage flip-flop, and turning ON the level shifter when the input signal is transmitted by the y-th stage flip-flop, where s, x and y are arbitrary integers, and $s \leq x < y$, the s-th, x-th and y-th stage flip-flops are counted according to the shift directions.

* * * * *